US008625320B1

(12) United States Patent
Argyres

(10) Patent No.: US 8,625,320 B1
(45) Date of Patent: Jan. 7, 2014

(54) QUATERNARY CONTENT ADDRESSABLE MEMORY CELL HAVING ONE TRANSISTOR PULL-DOWN STACK

(75) Inventor: Dimitri Argyres, San Jose, CA (US)

(73) Assignee: NetLogic Microsystems, Inc., Irvine, CA (US)

( * ) Notice: Subject to any disclaimer, the term of this patent is extended or adjusted under 35 U.S.C. 154(b) by 64 days.

(21) Appl. No.: 13/216,104

(22) Filed: Aug. 23, 2011

Related U.S. Application Data

(63) Continuation-in-part of application No. 13/015,543, filed on Jan. 27, 2011, now Pat. No. 8,462,532.

(60) Provisional application No. 61/378,808, filed on Aug. 31, 2010.

(51) Int. Cl.
*G11C 15/00* (2006.01)

(52) U.S. Cl.
USPC .................... 365/49.1; 365/49.11; 365/19.17; 365/49.18

(58) Field of Classification Search
USPC ................ 365/49.1, 49.17, 154, 49.11, 49.18
See application file for complete search history.

(56) References Cited

U.S. PATENT DOCUMENTS

| 3,665,422 A | 5/1972 | McCoy et al. |
|---|---|---|
| 4,112,502 A | 9/1978 | Scheuneman |
| 4,747,080 A | 5/1988 | Yamada |
| 4,779,226 A | 10/1988 | Haraszti |
| 4,791,606 A | 12/1988 | Threewitt et al. |
| 4,903,268 A | 2/1990 | Hidaka et al. |
| 4,958,352 A | 9/1990 | Noguchi et al. |
| 4,991,136 A | 2/1991 | Mihara |
| 5,046,046 A | 9/1991 | Sweha et al. |
| 5,127,014 A | 6/1992 | Raynham |
| 5,184,325 A | 2/1993 | Lipovski |
| 5,233,614 A | 8/1993 | Singh |
| 5,311,462 A | 5/1994 | Wells |
| 5,319,589 A | 6/1994 | Yamagata et al. |
| 5,319,590 A | 6/1994 | Montoye |
| 5,450,424 A | 9/1995 | Okugaki et al. |
| 5,452,243 A | 9/1995 | Ansel et al. |
| 5,455,834 A | 10/1995 | Chang et al. |
| 5,469,450 A | 11/1995 | Cho et al. |
| 5,491,703 A | 2/1996 | Barnaby et al. |
| 5,561,429 A | 10/1996 | Halberstam et al. |
| 5,568,415 A * | 10/1996 | McLellan et al. .......... 365/49.17 |
| 5,570,377 A | 10/1996 | Gonzalez et al. |
| 5,572,460 A | 11/1996 | Lien |

(Continued)

OTHER PUBLICATIONS

Ex Parte Quayle Action, dated Nov. 7, 2012, for U.S. Appl. No. 13/015,543, filed Jan. 27, 2011, 6 pages.

(Continued)

*Primary Examiner* — Thao Bui
(74) *Attorney, Agent, or Firm* — Sterne Kessler Goldstein & Fox PLLC

(57) ABSTRACT

Quaternary CAM cells are provided that include a compare circuit having a discharge path between a match line and ground potential, the single discharge path consisting essentially of a single transistor. In an embodiment, the single transistor has a gate coupled to a pull-down node and the compare circuit includes first and second gating transistors connected in series between the pull-down node and a ground potential, the first gating transistor having a gate to receive a comparand bit, and the second gating transistor having a gate to receive a complemented comparand bit.

21 Claims, 15 Drawing Sheets

(56) References Cited

U.S. PATENT DOCUMENTS

| | | | |
|---|---|---|---|
| 5,598,115 A * | 1/1997 | Holst | 326/119 |
| 5,604,753 A | 2/1997 | Bauer et al. | |
| 5,629,950 A | 5/1997 | Godiwala et al. | |
| 5,642,320 A | 6/1997 | Jang | |
| 5,644,583 A | 7/1997 | Garcia et al. | |
| 5,682,394 A | 10/1997 | Blake et al. | |
| 5,699,369 A | 12/1997 | Guha | |
| 5,724,296 A | 3/1998 | Jang | |
| 5,727,003 A | 3/1998 | Zook | |
| 5,761,222 A | 6/1998 | Baldi | |
| 5,796,671 A | 8/1998 | Wahlstrom | |
| 5,796,758 A | 8/1998 | Levitan | |
| 5,872,802 A | 2/1999 | Knaack et al. | |
| 5,890,201 A | 3/1999 | McLellan et al. | |
| 6,009,548 A | 12/1999 | Chen et al. | |
| 6,032,214 A | 2/2000 | Farmwald et al. | |
| 6,058,500 A | 5/2000 | DesJardins et al. | |
| 6,067,656 A | 5/2000 | Rusu et al. | |
| 6,128,207 A | 10/2000 | Lien et al. | |
| 6,134,631 A | 10/2000 | Jennings, III | |
| 6,137,707 A | 10/2000 | Srinivasan et al. | |
| 6,151,247 A | 11/2000 | Estakhri et al. | |
| 6,154,384 A | 11/2000 | Nataraj et al. | |
| 6,188,629 B1 | 2/2001 | Kaplinsky | |
| 6,199,140 B1 | 3/2001 | Srinivasan et al. | |
| 6,216,246 B1 | 4/2001 | Shau | |
| 6,219,815 B1 | 4/2001 | DesJardins et al. | |
| 6,233,717 B1 | 5/2001 | Choi | |
| 6,243,281 B1 | 6/2001 | Pereira | |
| 6,262,907 B1 | 7/2001 | Lien et al. | |
| 6,289,471 B1 | 9/2001 | Gordon | |
| 6,324,087 B1 | 11/2001 | Pereira | |
| 6,362,990 B1 | 3/2002 | Gibson et al. | |
| 6,362,993 B1 | 3/2002 | Henderson et al. | |
| 6,374,325 B1 | 4/2002 | Simpson et al. | |
| 6,381,191 B2 | 4/2002 | Ooishi | |
| 6,385,070 B1 | 5/2002 | Peterson | |
| 6,397,290 B1 | 5/2002 | Williams et al. | |
| 6,400,593 B1 | 6/2002 | Lien et al. | |
| 6,408,417 B1 | 6/2002 | Moudgal et al. | |
| 6,418,042 B1 | 7/2002 | Srinivasan et al. | |
| 6,421,265 B1 | 7/2002 | Lien et al. | |
| 6,430,073 B1 | 8/2002 | Batson et al. | |
| 6,434,033 B1 | 8/2002 | Chien | |
| 6,460,112 B1 | 10/2002 | Srinivasan et al. | |
| 6,470,418 B1 | 10/2002 | Lien et al. | |
| 6,477,615 B1 | 11/2002 | Tanaka | |
| 6,480,406 B1 | 11/2002 | Jin et al. | |
| 6,496,399 B1 | 12/2002 | Choi et al. | |
| 6,505,270 B1 | 1/2003 | Voelkel et al. | |
| 6,538,911 B1 | 3/2003 | Allan et al. | |
| 6,542,391 B2 | 4/2003 | Pereira et al. | |
| 6,560,156 B2 | 5/2003 | Lien et al. | |
| 6,563,754 B1 | 5/2003 | Lien et al. | |
| 6,564,754 B1 | 5/2003 | Cohen | |
| 6,597,595 B1 | 7/2003 | Ichiriu et al. | |
| 6,618,281 B1 | 9/2003 | Gordon | |
| 6,646,900 B2 | 11/2003 | Tsuda et al. | |
| 6,665,220 B2 | 12/2003 | Vlasenko | |
| 6,690,595 B1 | 2/2004 | Srinivasan et al. | |
| 6,700,810 B1 | 3/2004 | Ichiriu et al. | |
| 6,700,827 B2 | 3/2004 | Lien et al. | |
| 6,707,693 B1 | 3/2004 | Ichiriu | |
| 6,721,202 B1 | 4/2004 | Roge et al. | |
| 6,728,124 B1 | 4/2004 | Ichiriu et al. | |
| 6,741,253 B2 | 5/2004 | Radke et al. | |
| 6,760,241 B1 | 7/2004 | Gharia | |
| 6,760,881 B2 | 7/2004 | Batson et al. | |
| 6,775,168 B1 | 8/2004 | Park et al. | |
| 6,807,077 B2 | 10/2004 | Noda et al. | |
| 6,842,360 B1 | 1/2005 | Srinivasan | |
| 6,845,026 B1 | 1/2005 | Gharia | |
| 6,856,527 B1 * | 2/2005 | Srinivasan et al. | 365/49.1 |
| 6,865,098 B1 | 3/2005 | Ichiriu et al. | |
| 6,867,989 B1 | 3/2005 | Roy | |
| 6,888,731 B2 | 5/2005 | Roth et al. | |
| 6,900,999 B1 | 5/2005 | Yen et al. | |
| 7,009,862 B2 | 3/2006 | Higeta et al. | |
| 7,050,318 B1 | 5/2006 | Argyres | |
| 7,133,302 B1 | 11/2006 | Srinivasan et al. | |
| 7,298,635 B1 | 11/2007 | Maheshwari | |
| 7,319,602 B1 * | 1/2008 | Srinivasan et al. | 365/49.1 |
| 7,433,217 B1 | 10/2008 | Maheshwarl | |
| 7,499,303 B2 | 3/2009 | Lien et al. | |
| 7,924,588 B2 | 4/2011 | Arsovski et al. | |
| 7,944,724 B2 | 5/2011 | Chu | |
| 8,462,532 B1 | 6/2013 | Argyres | |

OTHER PUBLICATIONS

Non-Final Action, dated Nov. 23, 2012, for U.S. Appl. No. 13/149,878, filed May 31, 2011, 5 pages.

Notice of Allowance, dated Oct. 10, 2012, for U.S. Appl. No. 13/149,885, filed May 31, 2011, 9 pages.

U.S. Appl. No. 13/015,543, entitled "Fast Quaternary Content Addressable Memory Cell," filed, Jan. 27, 2011.

U.S. Appl. No. 13/149,878, entitiled "Ternary Content Addressable Memory Cell Having Single Transistor Pull-Down Stack," filed May 31, 2011.

U.S. Appl. No. 13/149,885, entitled "Ternary Content Addressable Memory Cell Having Two Transistor Pull-Down Stack," filed May 31, 2011.

Notice of Allowance, dated Jan. 23, 2013, for U.S. Appl. No. 13/015,543, filed Jan. 27, 2011, 7 pages.

Notice of Allowance, dated Feb. 14, 2013, for U.S. Appl. No. 13/015,543, filed Jan. 27, 2011, 8 pages.

Notice of Allowance, dated Mar. 7, 2013, for U.S. Appl. No. 13/149,878, filed May 31, 2011, 5 pages.

Notice of Allowance, dated Jan. 29, 2013, for U.S. Appl. No. 13/149,885, filed May 31, 2011, 5 pages.

Application Note AN-94 "Error Detection and Correction with IDT49C466", released by Integrated Device Technology, Inc., pp. 131-141, (1996).

F. Halsall, Data Communications, Computer Networks and OSI, 2d. Ed., pp. 499-508, Addison-Wesley Publ. Co. (1998).

Fourouzan, Behrouz, "Introduction to Telecommunications and Networking." Chapter 8, pp. 194-226, Aug. 1997.

Kalter et al., "A 50-ns. 16-Mb DRAM with a 10-ns Data Rate and On-Chip ECC," IEEE Journal of Solid-State Circuits vol. 25, No. 5, Oct. 1990 pp. 1118-1127.

SiberCore Technologies, Soft Error in TCAMS: Causes and Cures, Jul. 2003, 5 pages.

Notice of Allowance, dated May 24, 2013, for U.S. Appl. No. 13/149,885, filed May 31, 2011, 6 pages.

Notice of Allowance, dated Jul. 9, 2013, for U.S. Appl. No. 13/149,878, filed May 31, 2011, 8 pages.

* cited by examiner

| X | Y | Data value |
|---|---|---|
| 0 | 0 | Don't care |
| 0 | 1 | 1 |
| 1 | 0 | 0 |
| 1 | 1 | invalid |

| CAM(X) | Mask(Y) | Data Value | |
|---|---|---|---|
| 0 | 0 | Don't care | — 670 |
| 0 | 1 | 1 | — 672 |
| 1 | 0 | 0 | — 674 |
| 1 | 1 | Don't care | — 676 |

…

QUATERNARY CONTENT ADDRESSABLE MEMORY CELL HAVING ONE TRANSISTOR PULL-DOWN STACK

CROSS-REFERENCE TO RELATED APPLICATIONS

This application claims the benefit under 35 USC 119(e) of the co-pending and commonly owned U.S. Provisional Application No. 61/378,808 entitled "Fast Quaternary CAM Cell" filed on Aug. 31, 2010, which is incorporated herein by reference in its entirety, and is also a continuation-in-part of, and claims the benefit under 35 USC 120 of commonly owned U.S. patent application Ser. No. 13/015,543 entitled "Fast Quaternary CAM Cell" filed on Jan. 27, 2011 now U.S. Pat. No. 8,462,532, which is incorporated herein by reference in its entirety.

TECHNICAL FIELD

The present embodiments generally relate to content addressable memory (CAM) devices, and more particularly to quaternary and ternary CAM cells.

BACKGROUND

Content addressable memory (CAM) devices are frequently used in network switching and routing applications to determine forwarding destinations for data packets. A CAM device can be instructed to compare a selected portion of an incoming packet (e.g., a destination address extracted from the packet header) with CAM words (e.g., forwarding address) stored in an array within the CAM device. If there is a matching entry stored in the CAM array, the index of the matching CAM word can be used to access a corresponding location in an associated memory device to retrieve a destination address and/or other routing information for the packet.

A CAM device includes a CAM array having a plurality of CAM cells organized in a number of rows and columns. Each row of CAM cells, which can be used to store a CAM word, is coupled to a corresponding match line that indicates match results for the row. Each column of CAM cells is typically coupled to one or more data lines or data line pairs that can be used to drive data into a selected CAM row during write operations and/or for providing a search key to the CAM rows during compare operations. During a compare operation, the search key (e.g., the comparand word) is provided to the CAM array and compared with the CAM words stored therein. For each CAM word that matches the search key, a corresponding match line is asserted to indicate the match result. If any of the match lines are asserted, a match flag is asserted to indicate the match condition, and a priority encoder determines the match address or index of the highest priority matching entry in the CAM array.

CAM arrays typically include either binary CAM cells that store binary data values (i.e., a logic "1" or a logic "0" value) or ternary CAM cells that store ternary data values (i.e., a logic "1" value, a logic "0" values, or a don't care value). Ternary CAM cells store a data bit and a mask bit. For example, when a mask bit within a ternary CAM cell is inactive (e.g., set to a logic 1 value), the ternary CAM cell operates as a conventional binary CAM cell storing an "unmasked" data bit. When the mask bit is active (e.g., set to a logic 0 value), the ternary CAM cell is treated as storing a "don't care" value, which means that all compare operations performed on the actively masked ternary CAM cell will result in a cell match condition.

FIG. 1A shows a well-known quaternary CAM cell 100 of the type described in U.S. Pat. No. 5,319,590 issued to Montoye, the disclosure of which is incorporated herein by reference. Quaternary CAM cells, which are also referred to as XY CAM cells, include two storage cells 120 and 122 coupled to a compare circuit 130. The two data bits X and Y can collectively represent four possible states: "0", "1", "don't care", and a fourth state which may be left unused or may indicate "invalid," as depicted in FIG. 1B. The logic "0" and "1" states correspond to the logic states represented, for example, by a conventional binary CAM cell. For each of these states, if the comparand data (e.g., provided to CAM cell 100 via complementary comparand lines CL and CLB) matches the data stored in CAM cell 100, compare circuit 130 does not discharge the match line ML, which indicates a match condition. Conversely, if the comparand data does not match the data stored in CAM cell 100, compare circuit 130 discharges ML (e.g., toward ground potential) to indicate the mismatch condition. For the "don't care" state, the logic low values for X and Y maintain respective transistors 132 and 134 in non-conductive states, thereby preventing compare circuit 130 from discharging ML. In this manner, data stored in CAM cell 100 is masked from the compare operation, thereby forcing a match condition for CAM cell 100, regardless of the comparand data. For the "invalid" state, the logic high values for X and Y maintain respective transistors 132 and 134 in conductive states. During a compare operation, one of the complementary comparand data bit pair provided on CL/CLB will be logic high, thereby causing compare circuit 130 to discharge ML to indicate the mismatch state, regardless of the comparand data.

Note that the XY CAM cell 100 stores a data value as a complimentary bit pair, where the Y bit stores the binary data value and the X bit stores the complemented binary data value. This allows XY CAM cell 100 to perform faster compare operations than conventional ternary CAM cells.

However, to keep up with demand for ever-increasing search rates, it would be desirable to increase the speed of XY CAM cells. It would also be desirable to reduce the footprint and capacitive loading of XY CAM cells.

BRIEF DESCRIPTION OF THE DRAWINGS

Present embodiments are illustrated by way of example, and not by way of limitation, in the figures of the accompanying drawings and in which like reference numerals refer to similar elements and in which.

DETAILED DESCRIPTION

Fast quaternary (XY) and ternary CAM cells including compare circuits having a reduced stack are disclosed. These CAM cells can be used in a wide variety of CAM architectures and applications for which speed is important. In the following description, for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present embodiments unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present embodiments are not to be construed as limited to specific examples described herein but rather include within their scope all embodiments defined by the appended claims.

More specifically, CAM cells architected in accordance with present embodiments include a compare circuit that has a fewer number of pull-down transistors coupled between the match line and ground potential than conventional CAM cells, which in turn increases the speed of compare operations performed by such CAM cells. More specifically, by reducing the size of the pull-down stack of the CAM cell's compare circuit, the capacitive load on the match line is reduced, which in turn allows the match line to be charged and discharged more quickly than CAM cells having larger compare stacks. In addition, reducing the number of pull-down transistors between the match line and ground potential also reduces the resistance of the compare stack, which increases search speeds. Further, the reduced match line capacitance resulting from the fewer number of pull-down transistors in the compare stack may also reduce power consumption.

Figure 2:
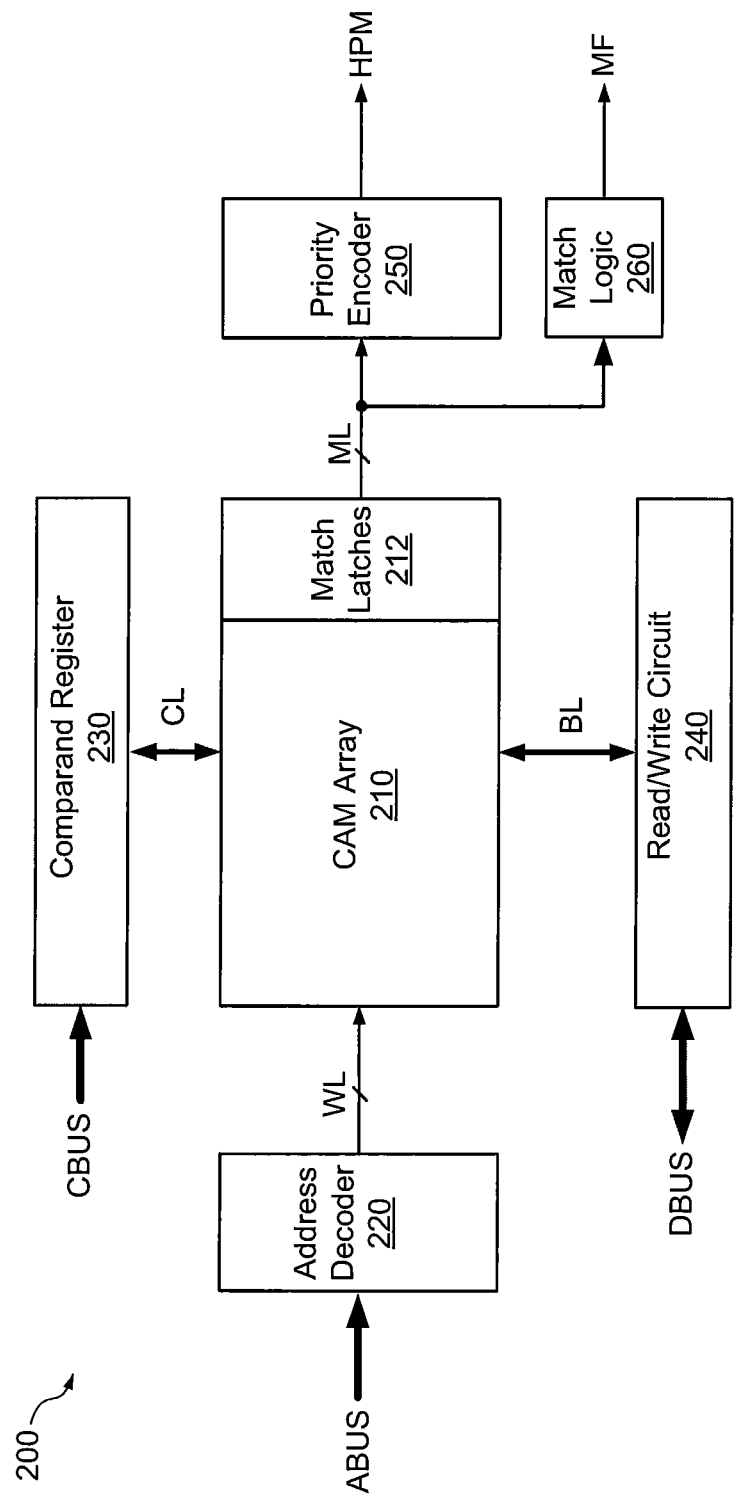
FIG. 2 is a block diagram of a CAM device within which the present embodiments may be implemented.

FIG. 2 is a block diagram of a CAM device within which CAM cells of present embodiments may be implemented. CAM device 200 includes a CAM array 210, an address decoder 220, a comparand register 230, a read/write circuit 240, a priority encoder circuit 250, and match logic 260. CAM array 210 includes any number of rows of CAM cells (not shown for simplicity in FIG. 2), where each row of CAM cells can be configured to store a data word. Further, while CAM array 210 is shown in FIG. 2 as a single CAM array, it may include any number of CAM array blocks that can be independently searched.

One or more instructions and related control signals may be provided to CAM device 200 from an instruction decoder (not shown for simplicity) to control read, write, compare, and other operations for CAM device 200. Other well-known signals that can be provided to CAM device 200, such as enable signals, clock signals, and power connections, are not shown for simplicity. Further, although not shown in FIG. 2, each row of CAM cells in CAM array 210 may have one or more validity bits to indicate whether the corresponding row (or any segment thereof) of CAM cells stores valid data.

Each row of CAM cells (not shown in FIG. 2 for simplicity) in CAM array 210 is coupled to address decoder 220 via a corresponding word line WL, and to match latches 212, to priority encoder 250, and to well-known match logic 260 via a corresponding match line ML. For simplicity, the word lines and match lines are represented collectively in FIG. 2. Address decoder 220 is well-known, and includes circuitry to select corresponding rows in CAM array 210 for read, write, and/or other operations in response to an address received from an address bus ABUS using the word lines WL. For other embodiments, addresses may be provided to address decoder 220 from another suitable bus and/or circuitry.

The match lines ML provide match results for compare operations between comparand data (e.g., a search key) and data stored in CAM array 210. Priority encoder 250, which is well-known, uses the match results indicated on the match lines and latched in the match latches 212 to determine the matching entry that has the highest priority number associated with it and generates the index or address of this highest priority match (HPM). In addition, priority encoder 250 may use the validity bits from CAM array 210 to generate the next free address that is available in CAM array 210 for storing new data. Although not shown in FIG. 2, for some embodiments, priority encoder 250 may provide the next free address to the address decoder 220.

Match logic 260, which is well-known, uses the match results indicated on the match lines to generate a match flag (MF) indicative of a match condition in CAM array 210. If there is more than one matching entry in CAM array 210, match logic 260 may generate a multiple match flag MF to indicate a multiple match condition. In addition, match logic 260 may use the validity bits from CAM array 210 to assert a full flag when all of the rows of CAM cells in CAM array 210 are filled with valid entries.

Each column of CAM cells (not shown in FIG. 2 for simplicity) in CAM array 210 is coupled to comparand register 230 via one or more corresponding comparand lines CL, and is coupled to read/write circuit 240 via one or more corresponding bit lines BL. For simplicity, the comparand lines CL and bit lines BL are represented collectively in FIG. 2. Comparand register 230 is well-known, and is configured to provide a search key (e.g., a comparand word) received from a comparand bus CBUS to CAM array 210 during compare operations with data stored therein. For other embodiments, the search key can be provided to CAM array 210 via another bus and/or circuit. Read/write circuit 240 includes well-known write drivers to write data received from a data bus DBUS to CAM array 210 via the bit lines BL, and includes well-known sense amplifiers to read data from CAM array 210 onto DBUS. For other embodiments, read/write circuit 240 may be coupled to a bus other than DBUS. Further, although not shown in FIG. 2 for simplicity, CAM device 200 can include a well-known global mask circuit (e.g., coupled to the comparand register 230) that can selectively mask the bits of the search key provided to the CAM array 210.

Figure 3:
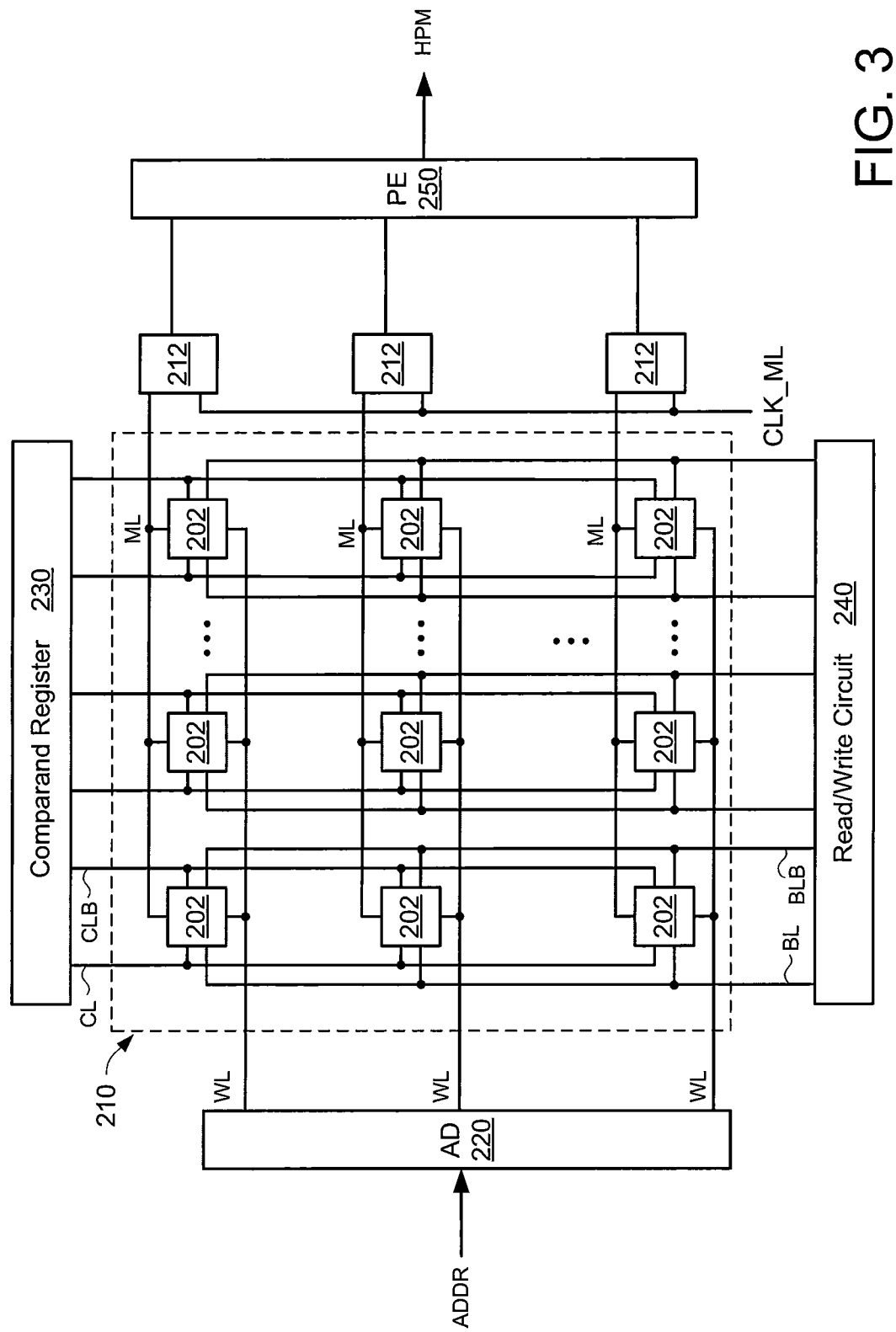
FIG. 3 is a block diagram of one embodiment of the CAM array of FIG. 2.

FIG. 3 is a more detailed block diagram of the CAM array 210 of FIG. 2. CAM array 210 is shown to include a plurality of CAM cells 202 organized in any number of rows and columns. The CAM cells 202 can be any suitable type of CAM cell including, for example, binary CAM cells, ternary CAM cells, and/or quaternary CAM cells. As noted above, each row of CAM array 210 may also include one or more validity bits. Each row of CAM cells 202 is coupled to a match line ML and to a word line WL. Each word line WL is driven by address decoder 220 (see also FIG. 2) to select one or more rows of CAM cells 202 for writing or reading. Each match line ML is coupled to priority encoder 250 via a corresponding match latch 212, which together form the match latches 212 of FIG. 2. The match latches 212 are clocked by a match latch clock signal CLK_mL in a well-known manner. Each column of CAM cells 202 in CAM array 210 is coupled to read/write circuit 240 via a complementary bit line pair BL/BLB, and to comparand register 230 via a complementary comparand line pair CL/CLB.

Prior to compare operations, the match lines ML are pre-charged (e.g., to logic high), and each set of complementary comparand line pairs CL/CLB are driven to the same predetermined logic level (e.g., to logic high). Then, during compare operations, the comparand register 230 provides the search key (e.g., the comparand word) to the CAM cells 202 by driving each pair of complementary comparand lines CL/CLB to opposite logic states indicative of the corresponding bit of the search key. For example, to provide a logic low comparand bit (C) to a column of CAM cells, the corresponding comparand line CL is driven to a first logic state (e.g., logic low) and the corresponding complementary comparand line CLB is driven to a second logic state (e.g., logic high); conversely, to provide a logic high comparand bit C to the column of CAM cells, the corresponding comparand line CL is driven to the second logic state (e.g., logic high) and the corresponding complementary comparand line CLB is driven to the first logic state (e.g., logic low). Thereafter, if all the CAM cells 202 in a particular row match the corresponding bits of the search key, then the match line ML remains in its logic high state to indicate the match condition. Conversely, if one or more of the CAM cells 202 in the row do not match the corresponding bit of the search key, then mismatching CAM cells 202 discharge the match line ML (e.g., toward ground potential) to indicate the mismatch condition.

Figures 1A, 1B:
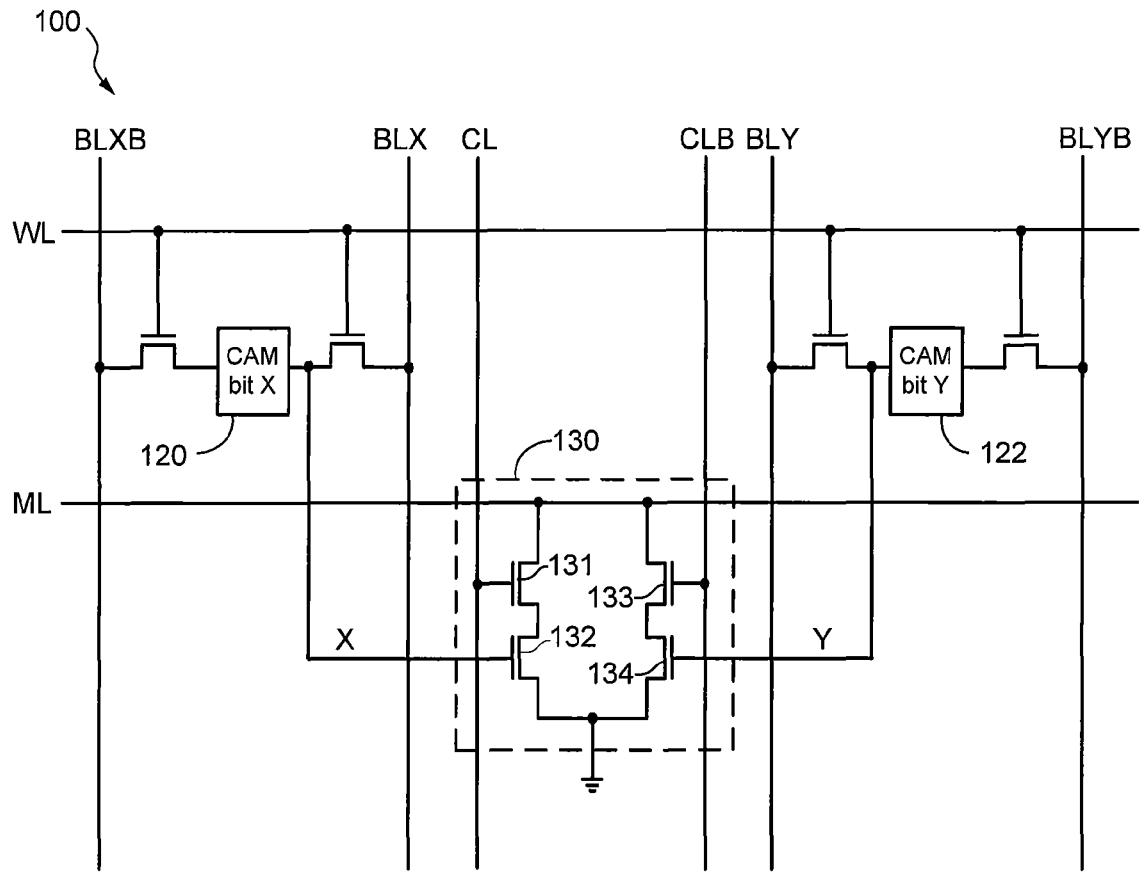
FIG. 1A is a circuit diagram of a conventional quaternary (XY) CAM cell.
FIG. 1B shows a truth table for conventional data storage of the XY CAM cell of FIG. 1A.
Figure 4:
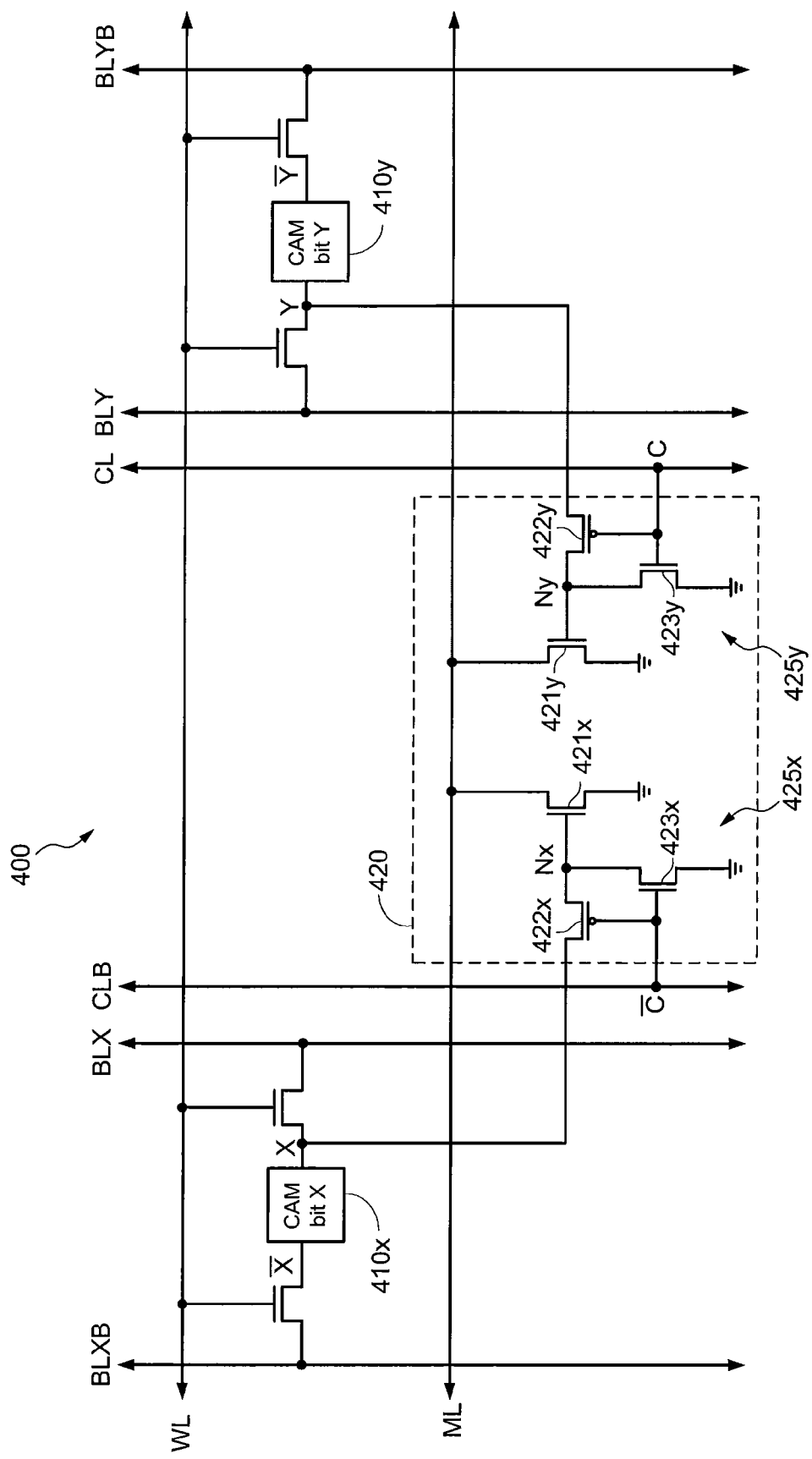
FIG. 4 is a block diagram of an XY CAM cell according to some embodiments.

FIG. 4 shows a quaternary (XY) CAM cell 400 in accordance with the present embodiments. The XY CAM cell 400 includes two memory cells 410x and 410y coupled to a compare circuit 420. The memory cells 410x and 410y can be any suitable type of storage cell including, for example, an SRAM cell, a DRAM cell, an EEPROM cell, a flash memory cell, a latch, or a register. For some embodiments, memory cells 410 are formed using cross-coupled CMOS inverter circuits, as known in the art. The first memory cell 410x stores a first data bit "X", and the second memory cell 410y stores a second data bit "Y". Together, the two data bits X and Y can collectively represent a data value D having four possible states: "0", "1", "don't care", and a fourth state which may be left unused or may indicate "invalid," as depicted in the truth table 150 of FIG. 1B.

More specifically, the logic "0" and "1" states correspond to the logic states represented by a conventional binary CAM cell. For each of these states, if the comparand data (e.g., provided to CAM cell 400 via complementary comparand lines CL and CLB) matches the data stored in CAM cell 400, the compare circuit 420 does not discharge the match line ML, which remains in its charged state to indicate a match condition. Conversely, if the comparand data does not match the data stored in CAM cell 400, compare circuit 420 discharges ML (e.g., toward ground potential) to indicate the mismatch condition. For the "don't care" state, the logic low values for X and Y cause compare circuit 420 to remain in a non-conductive state, thereby preventing the match line from discharging. In this manner, the data value D stored in CAM cell 400 is masked from the compare operation, thereby forcing a match condition for CAM cell 400, regardless of the comparand data. For the "invalid" state, the logic high values for X and Y cause the compare circuit 420 to remain in a conductive state to discharge the match line to indicate a mismatch condition, irrespective of the comparand data. For some embodiments, the "invalid" state can be used to disable a row of CAM array 210 containing one or more XY CAM cells 400, for example, as described in commonly-owned U.S. Pat. No. 6,865,098, which is incorporated by reference herein in its entirety.

The compare circuit 420 includes two match line pull-down transistors 421x and 421y, two pass transistors 422x and 422y, and two gating transistors 423x and 423y. A first group of transistors 421x, 422x, and 423x forms a first selective pull-down circuit 425x that selectively discharges the match line ML in response to a comparison of the complemented comparand bit ($\overline{C}$) provided on CLB and the first data bit (X), and a second group of transistors 421y, 422y, and 423y forms a second selective pull-down circuit 425y that selectively discharges the match line ML in response to a comparison of the comparand bit (C) provided on CL and the second data bit (Y).

More specifically, for the first selective pull-down circuit 425x, the NMOS match line pull-down transistor 421x is coupled between the match line ML and ground potential, and has a gate tied to a first node (Nx) that, in turn, is selectively coupled to receive X from the first memory cell 410x via the PMOS pass transistor 422x. The NMOS gating transistor 423x is coupled between the gate of match line pull-down transistor 421x and ground potential. The common gates of transistors 422x and 423x are coupled to the complementary comparand line CLB, and receive the complemented comparand bit ($\overline{C}$) during compare operations. For the second selective pull-down circuit 425y, the NMOS match line pull-down transistor 421y is coupled between the match line ML and ground potential, and has a gate tied to a second node (Ny) that, in turn, is selectively coupled to receive Y from the second memory cell 410y via the PMOS pass transistor 422y. The NMOS gating transistor 423y is coupled between the gate of match line pull-down transistor 421y and ground potential. The common gates of transistors 422y and 423y are coupled to the comparand line CL, and receive the comparand bit (C) during compare operations.

For other embodiments, the first node Nx can be coupled to receive the complemented first data bit $\overline{X}$, the second node Ny can be coupled to receive the complemented second data bit $\overline{Y}$, the common gates of transistors 422x and 423x can receive the comparand bit C, and the common gates of transistors 422y and 423y can receive the complemented comparand bit $\overline{C}$. For such embodiments, the don't care state is obtained when X=Y=1, and the invalid state is obtained when X=Y=0.

An exemplary compare operation between a comparand bit C and a data value D stored in the CAM cell 400 is now described. During a pre-charge phase of the compare operation, the match line ML is pre-charged to logic high (e.g., towards VDD) by a suitable pre-charge circuit (not shown for simplicity), and the comparand lines CL/CLB are both precharged to logic high (e.g., towards VDD). The logic high state of CLB turns on NMOS transistor 423x and turns off PMOS transistor 422x. The conductive state of transistor 423x pulls the gate of match line pull-down transistor 421x (e.g., at node Nx) low towards ground potential, thereby maintaining transistor 421x in a non-conductive state to isolate the match line ML from ground potential. The non-conductive state of transistor 422x isolates the first memory cell 410x from node Nx, thereby preventing the value of X from being pulled low to ground potential by the conductive NMOS transistor 423x. Similarly, the logic high state of CL turns on NMOS transistor 423y and turns off PMOS transistor 422y. The conductive state of transistor 423y pulls the gate of match line pull-down transistor 421y (e.g., at node Ny) low towards ground potential, thereby maintaining transistor 421y in a non-conductive state to isolate the match line ML from ground potential. The non-conductive state of transistor 422y isolates the second memory cell 410y from node Ny, thereby preventing the value of Y from being pulled low to ground potential by the conductive NMOS transistor 423y.

Then, during an evaluation phase of the compare operation, the comparand bit C is provided in a complementary manner to the XY CAM cell 400 via comparand lines CL and CLB. If a comparand line is driven to logic high, then the corresponding selective pull-down circuit 425 is disabled and does not discharge the match line ML. Conversely, if a comparand line is driven to logic low, then the corresponding selective pull-down circuit 425 is enabled and selectively discharges the match line ML in response to the corresponding data bit provided by the associated memory cell 410. If both CL and CLB are driven to logic high (e.g., to achieve a column-masking function), then both selective pull-down circuits 425x and 425y are disabled and together prevent the match line ML from discharging, thereby causing the CAM cell 400 to indicate a match condition on ML irrespective of the data value D.

For one example, if the comparand bit is logic high (e.g., C=1 and $\overline{C}$=0), then CL is driven to logic high and CLB is driven to logic low. The logic high state of CL disables the second selective pull-down circuit 425y (in the manner described above), and prevents the second data bit Y stored in second memory cell 410y from affecting the compare operation. The logic low state of CLB enables the first selective pull-down circuit 425x (in the manner described above), and allows the first data bit X stored in first memory cell 410x to selectively discharge the match line ML. Thus, if the data bit stored in the cell 400 is logic high (e.g., D=1), as indicated by X=0 and Y=1, then the logic low value (X=0) output by first memory cell 410x propagates through pass gate 422x to node Nx. In response to X=0, NMOS pull-down transistor 421x does not turn on, and therefore the match line ML remains in its charged state to indicate the match condition between C=1 and D=1. Conversely, if the data bit is logic low (e.g., D=0), as indicated by X=1 and Y=0, then the logic high value (X=1) output by first memory cell 410x propagates through pass gate 422x to node Nx. In response to X=1, NMOS pull-down transistor 421x turns on and discharges the match line ML low toward ground potential to indicate the mismatch condition between C=1 and D=0.

The XY CAM cell 400 operates in a complementary manner for compare operations in which the comparand bit is logic low (e.g., C=0 and $\overline{C}$=1), where CL is driven to logic low and CLB is driven to logic high. More specifically, the logic low state of CL enables selective pull-down circuit 425y (in the manner described above), and allows the second data bit Y stored in second memory cell 410y to selectively discharge the match line ML. The logic high state of CLB disables selective pull-down circuit 425x (in the manner described above), and prevents the first data bit X stored in first memory cell 410x from affecting the compare operation. Thus, if the data bit is logic low (e.g., D=0), as indicated by X=1 and Y=0, then the logic low value (Y=0) output by second memory cell 410y propagates through pass gate 422y to node Ny. In response to Y=0, NMOS pull-down transistor 421y does not turn on, and therefore the match line ML remains in its charged state to indicate the match condition between C=0 and D=0. Conversely, if the data bit is logic high (e.g., D=1), as indicated by X=0 and Y=1, then the logic high value (Y=1) output by second memory cell 410y propagates through pass gate 422y to node Ny. In response to Y=1, NMOS pull-down transistor 421y turns on and discharges the match line ML low toward ground potential to indicate the mismatch condition between C=0 and D=1.

In accordance with the present embodiments, the compare circuit 420 of XY CAM cell 400 includes only one transistor (e.g., transistor 421) in each pull-down path between the match line ML and ground potential, as shown in FIG. 4. In contrast, the conventional XY CAM cell 100 of FIG. 1A includes two series-connected transistors (e.g., transistors 131-132 and 133-134, respectively) in each pull-down path between the match line ML and ground potential. As a result, the XY CAM cell 400 of present embodiments is faster than the conventional XY CAM cell 100 of FIG. 1A. More specifically, because the compare circuit 420 employs single stack pull-down elements (e.g., transistor 421) between the match line and ground potential, the XY CAM cell 400 puts less pull-down resistance and less capacitive loading on the match line than the 2-stack pull-down elements (e.g., transistors 131-132 and 133-134, respectively) employed in the conventional XY CAM cell 100, and therefore is faster than conventional XY CAM cell 100. Further, because each CAM cell 400 puts less capacitive loading on the match line, a CAM array such as CAM array 210 of FIG. 2 can employ more CAM cells 400 in each row without degrading performance, as compared to conventional CAM cells 100. Further, the reduced match line capacitance resulting from fewer pull-down transistors in the compare stack of CAM cell 400 may reduce power consumption, as compared with conventional XY CAM cells 100 of FIG. 1A.

Figure 5:
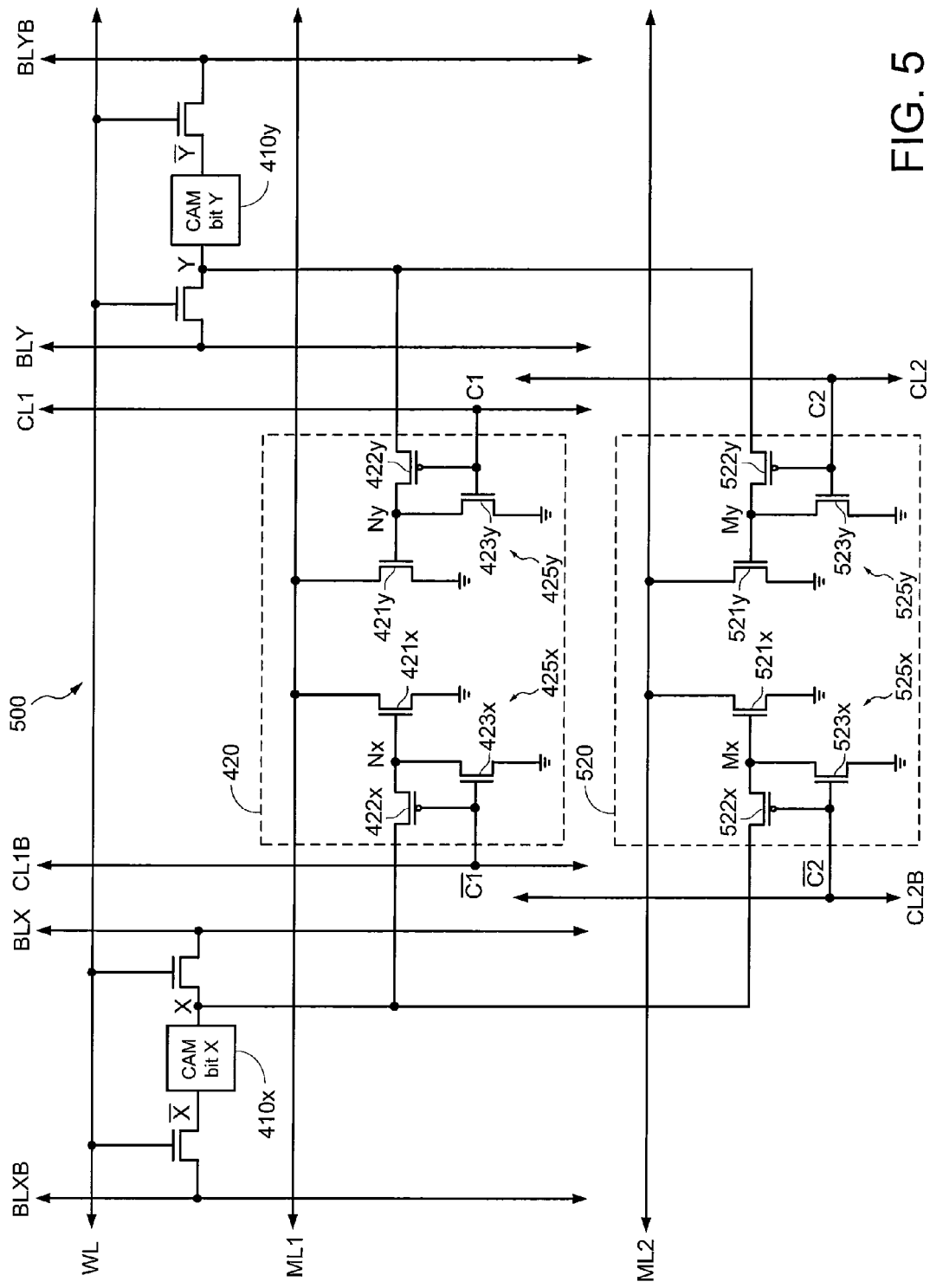
FIG. 5 is a block diagram of an XY CAM cell according to other embodiments.

FIG. 5 shows an XY CAM cell 500 in accordance with other embodiments. The XY CAM cell 500 is modified to include a second compare circuit 520 that allows CAM cell 500 to perform two compare operations with the data value D stored therein at the same time, or alternatively in a sequential (e.g., staggered) manner. More specifically, the XY CAM cell 500 can simultaneously compare the data value D with a first comparand bit (C1) provided on a first pair of complementary comparand lines CL1/CL1B and with a second comparand bit (C2) provided on a second pair of complementary comparand lines CL2/CL2B, where the first pair of complementary comparand lines CL1/CL1B provide the first comparand bit C1 and its complement $\overline{C1}$ to the first compare circuit 420, and the second pair of complementary comparand lines CL2/CL2B provide the second comparand bit C2 and its complement $\overline{C2}$ to the second compare circuit 520. Match conditions between the data value D and the first comparand bit C1 are provided on a first match line ML1 by the first compare circuit 420, and match conditions between the data value D and the second comparand bit C2 are provided on a second match line ML2 by the second compare circuit 520.

The second compare circuit 520 includes two match line pull-down transistors 521x and 521y, two pass transistors 522x and 522y, and two gating transistors 523x and 523y. A first group of transistors 521x, 522x, and 523x forms a first selective pull-down circuit 525x that selectively discharges the second match line ML2 in response to a comparison with the complemented second comparand bit ($\overline{C2}$) and the first data bit (X), and a second group of transistors 521y, 522y, and 523y forms a second selective pull-down circuit 525y that selectively discharges the second match line ML2 in response to a comparison with the second comparand bit (C2) and the second data bit (Y).

More specifically, for the first selective pull-down circuit 525x, the NMOS match line pull-down transistor 521x is coupled between the second match line ML2 and ground potential, and has a gate tied to a third node (Mx) that, in turn, is selectively coupled to receive X from the first memory cell 410x via the PMOS pass transistor 522x. The NMOS gating transistor 523x is coupled between the gate of match line pull-down transistor 521x and ground potential. The common gates of transistors 522x and 523x are coupled to the second complementary comparand line CL2B, and receive the complemented second comparand bit ($\overline{C2}$) during compare operations. For the second selective pull-down circuit 525y, the NMOS match line pull-down transistor 521y is coupled between the second match line ML2 and ground potential, and has a gate tied to a fourth node (My) that, in turn, is selectively coupled to receive Y from the second memory cell 410y via the PMOS pass transistor 522y. The NMOS gating transistor 523y is coupled between the gate of match line pull-down transistor 521y and ground potential. The common gates of transistors 522y and 523y are coupled to the second comparand line CL2, and receive the second comparand bit (C2) during compare operations.

Compare operations for XY CAM cell 500 are performed in a manner similar to that described above with respect to CAM cell 400 of FIG. 4, except that XY CAM cell 500 can perform two compare operations at the same time (or alternately in a sequential or staggered manner). Thus, during the pre-charge phase of the compare operation, the first and second match lines ML1 and ML2 are both pre-charged to logic high (e.g., towards VDD) by suitable pre-charge circuits (not shown for simplicity), and both sets of complementary comparand lines CL1/CL1B and CL2/CL2B are pre-charged to logic high (e.g., towards VDD). In this manner, during the pre-charge phase, the first compare circuit 420 isolates the first match line ML1 from ground potential, and the second compare circuit 520 isolates the second match line ML2 from ground potential.

Then, during the evaluation phase of the compare operation, the first comparand bit C1 is provided to the XY CAM cell 500 in a complementary manner via comparand lines CL1 and CL1B, and the second comparand bit C2 is provided to the XY CAM cell 500 in a complementary manner via comparand lines CL2 and CL2B. If a comparand line is driven to logic high, then the corresponding selective pull-down circuit 425/525 is disabled and does not discharge its associated match line ML. Conversely, if a comparand line is driven to logic low, then the corresponding selective pull-down circuit 425/525 is enabled and selectively discharges its associated match line ML in response to the corresponding data bit provided by the associated memory cell 410. More specifically, if both CL1 and CL1B are driven to logic high (e.g., to achieve a column-masking function), then both selective pull-down circuits 425x and 425y are disabled and together prevent the first match line ML1 from discharging, thereby causing the CAM cell 500 to indicate a match condition on ML1 irrespective of the data value D. Similarly, if both CL2 and CL2B are driven to logic high (e.g., to achieve a column-masking function), then both selective pull-down circuits 525x and 525y are disabled and together prevent the second match line ML2 from discharging, thereby causing the CAM cell 500 to indicate a match condition on ML2 irrespective of the data value D.

Similar to the first compare circuit 420, the second compare circuit 520 of XY CAM cell 500 includes only one transistor (e.g., transistor 521) in each pull-down path between the second match line ML2 and ground potential, as shown in FIG. 5. In contrast, the conventional XY CAM cell 100 of FIG. 1A includes two series-connected transistors (e.g., transistors 131-132 and 133-134, respectively) in each pull-down path between the match line ML and ground potential. As a result, the XY CAM cell 500 of present embodiments is faster than the conventional XY CAM cell 100 of FIG. 1A. More specifically, because the compare circuit 520 employs single stack pull-down elements (e.g., transistor 521) between the second match line ML2 and ground potential, the compare circuit 520 puts less pull-down resistance and less capacitive loading on the match line than the 2-stack pull-down elements (e.g., transistors 131-132 and 133-134, respectively) employed in the conventional XY CAM cell 100, and therefore is faster and may even consume less power than conventional XY CAM cell 100. Further, because each CAM cell 500 puts less capacitive loading on each of the match lines ML1 and ML2, a CAM array such as CAM array 210 of FIG. 2 can employ more CAM cells 500 in each row without degrading performance, as compared to conventional CAM cells 100.

Figure 6A:
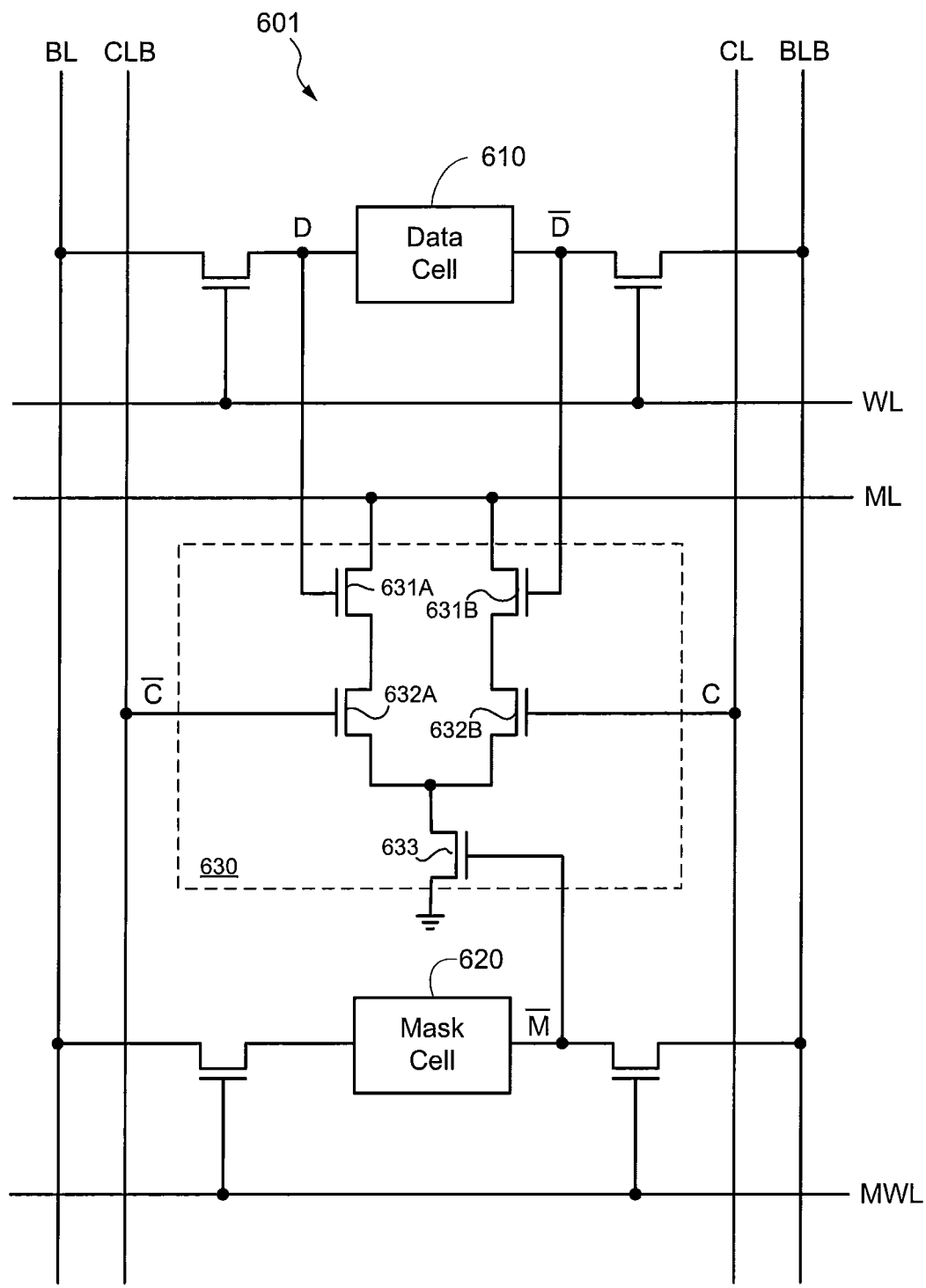
FIG. 6A is a block diagram of a ternary content addressable memory (TCAM) cell.

FIG. 6A is a block diagram of a ternary content addressable memory (TCAM) cell 601 with a data cell 610, a mask cell 620, and a compare circuit 630. The compare circuit 630 includes pull-down transistor pairs 631A-631B and 632A-632B, and is configured to receive complementary (also known as "differential" or "balanced") input signals. For example, the pull-down transistors 631A and 631B are controlled by complementary data signals D and $\overline{D}$, respectively, provided by the data cell 610, and the pull-down transistors 632A and 632B are controlled by complementary comparand bits $\overline{C}$ and C, respectively. The symmetrical structure and operation of compare circuit 630 is advantageous because it provides balanced impedances and mutually cancelled noises. However, the discharge path between the match line ML and ground potential for the CAM cell 601 includes 3 series-connected pull-down transistors 631, 632, and 633, which in turn results in slower performance than TCAM cells that have fewer transistors in their compare stack.

Figure 6B:
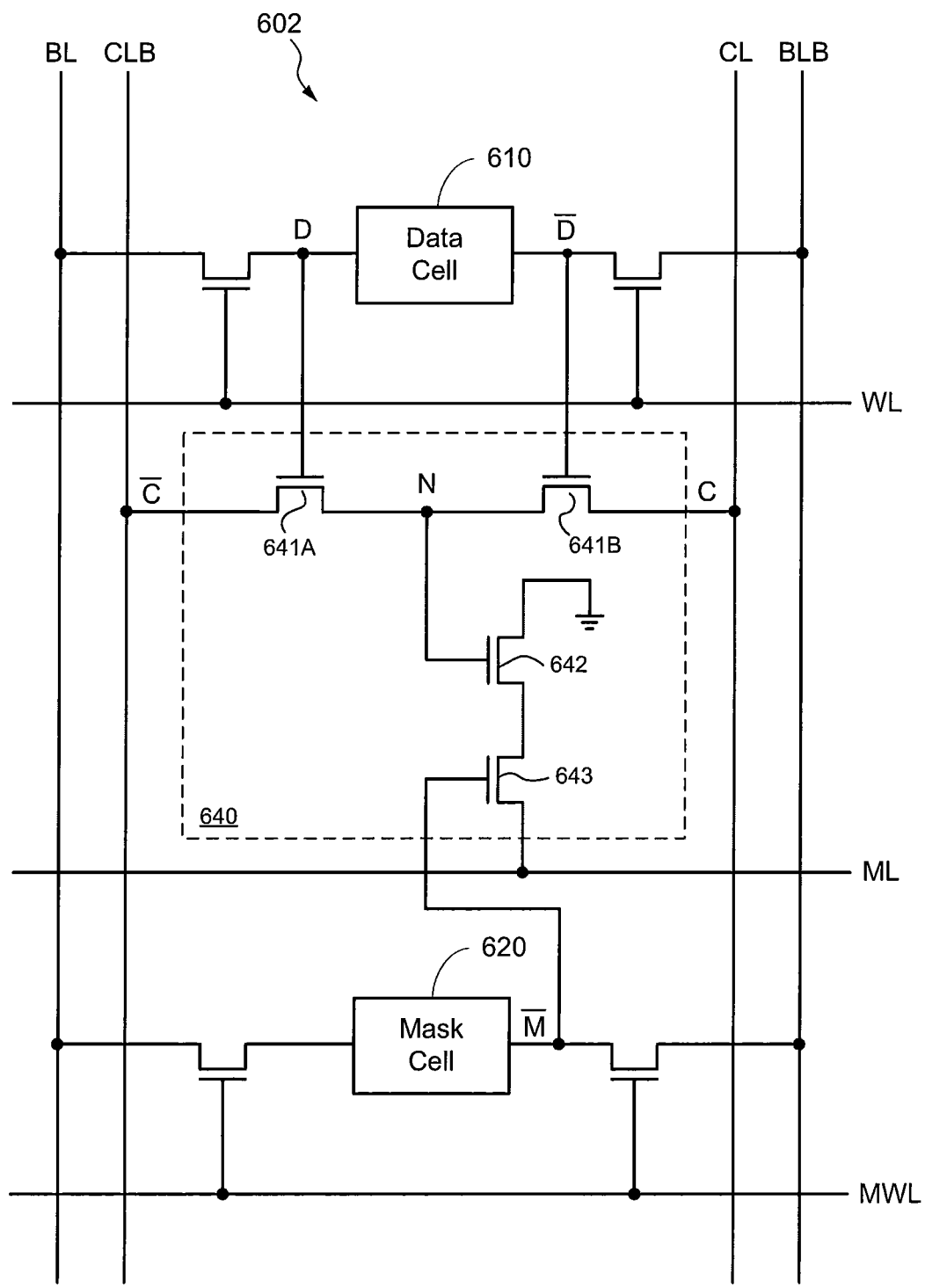
FIG. 6B is a block diagram of another TCAM cell.

FIG. 6B is a block diagram of another TCAM cell 602 having data cell 610, mask cell 620, and a compare circuit 640. The compare circuit 640 includes pass transistors 641A and 641B, and includes pull-down transistors 642 and 643. Transistor 641A is coupled between complementary comparand line CLB and a node N, and transistor 641B is coupled between the node N and comparand line CL. The gates of pass transistors 641A and 641B receive complementary data bits D and $\overline{D}$, respectively, from the data cell 610. Pull-down transistors 642 and 643 are connected in series between match line ML and ground potential, with the gate of transistor 642 coupled to node N, and with the gate of transistor 643 coupled to receive a complemented mask bit from the mask cell 620.

The CAM cell 602 has fewer transistors than the CAM cell 601 of FIG. 6A, and the compare circuit 640 has only 2 transistors connected in series between the match line ML and ground potential. As a result, the capacitance on match line ML is also smaller as compared to the CAM cell 601. However, there are several drawbacks of CAM cell 602. First, the current and time associated with driving the complementary comparand lines CL and CLB may be significantly higher for CAM cell 602 than for CAM cell 601. For example, because pass transistors 641A and 641B are controlled by complementary data bits D and $\overline{D}$, respectively, one of the pass transistors 641A and 641B may undesirably turn on during the pre-charge phase. Therefore, the charging circuitry (not shown) for CL and CLB drives not only the capacitance of the comparand lines, but also the source/drain capacitance of one of the pass transistors 641, the gate capacitance seen by the node N, and any associated parasitic capacitances. These extra capacitances adversely affect the performance and the scalability of the CAM cell 602.

Figures 6C, 6D:
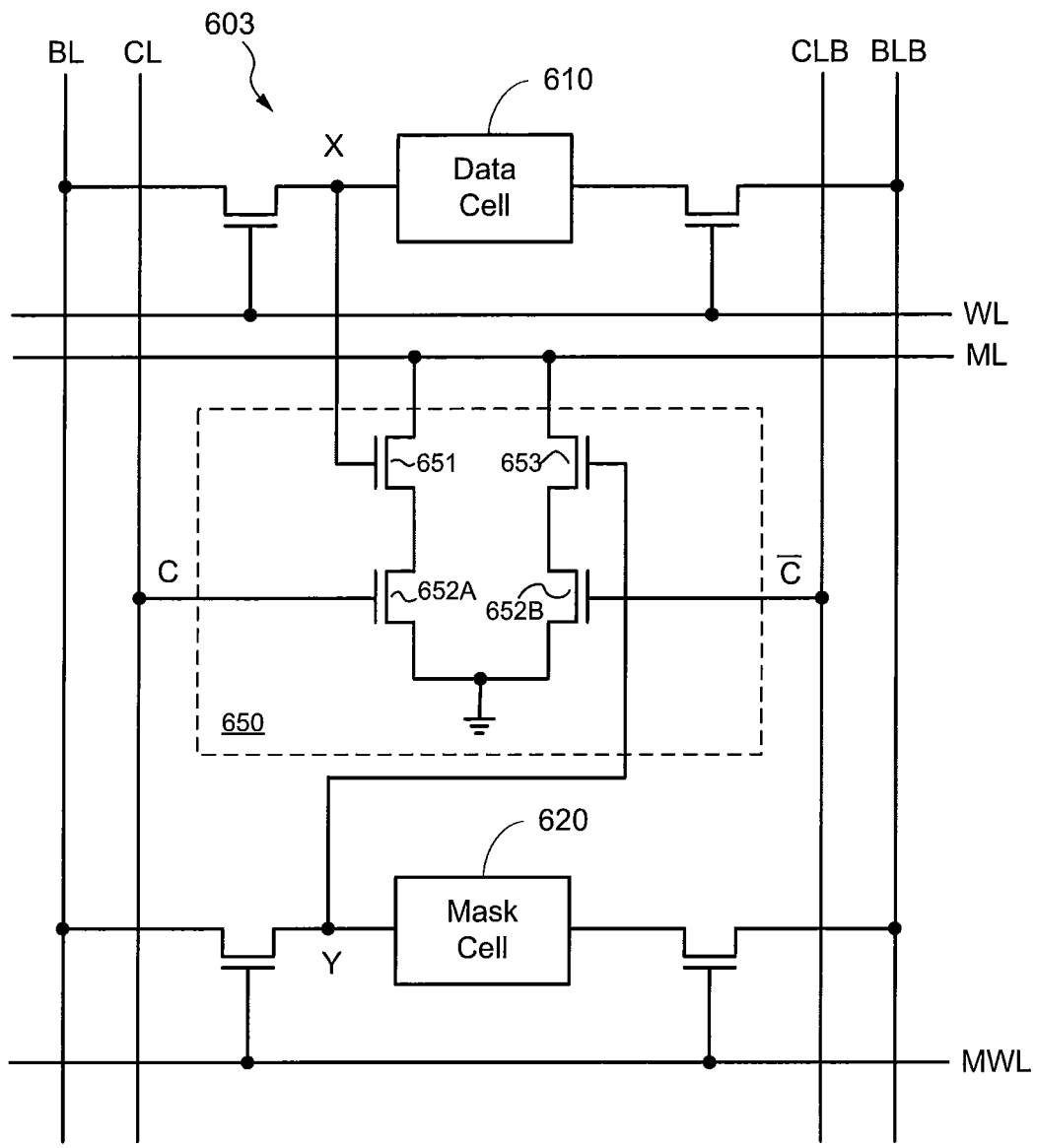
FIG. 6C is a block diagram of a TCAM cell that incorporates an XY encoding technique.
FIG. 6D shows a truth table for data storage of the TCAM cell of FIG. 6C.

FIG. 6C is a block diagram of a TCAM cell 603 that incorporates an XY bit encoding technique. TCAM cell 603 is structurally similar to the quaternary CAM cell 100 of FIG. 1A, except that TCAM cell 603 has only three possible states: "0", "1", and "don't care," as depicted in the truth table of FIG. 6D. More specifically, TCAM cell 603 is shown to include data cell 610, mask cell 620, and a compare circuit 650. The compare circuit 650 includes a first ML discharge path formed by pull-down transistors 651 and 652A, and includes a second ML discharge path formed by pull-down transistors 653 and 652B. The gate of transistor 651 receives a "data" bit (X) from data cell 610, and the gate of transistor 653 receives a "mask" bit (Y) from mask cell 620. The gate of transistor 652A receives the comparand bit C from the comparand line CL, and the gate of transistor 652B receives the complementary comparand bit $\overline{C}$ from the complementary comparand line CLB. Thus, the compare circuit 650 of CAM cell 603 is a 2-stack compare circuit.

Figure 7:
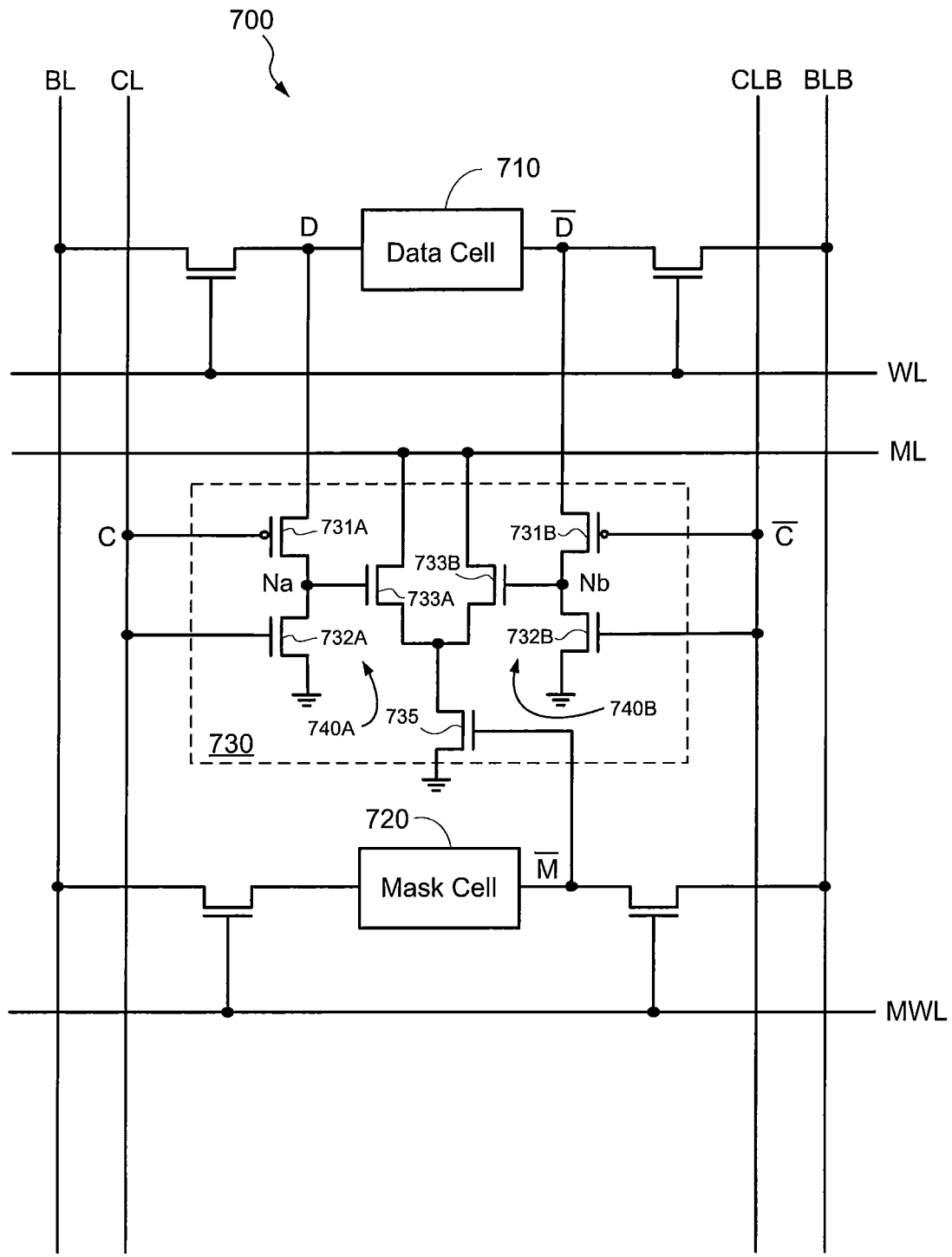
FIG. 7 is a block diagram of a TCAM cell according to some embodiments.

FIG. 7 shows a block diagram of a TCAM cell 700 in accordance with some embodiments. TCAM cell 700 includes a data cell 710, a mask cell 720, and a compare circuit 730. Both data cell 710 and mask cell 720 can be implemented with any suitable type of storage cell including, for example, an SRAM cell, DRAM cell, Flash memory cell, STT cell, and so on. The TCAM cell 700 can store three possible states: "0", "1", or "don't care." Thus, when TCAM cell 700 stores a "0" or a "1," TCAM cell 700 operates in a manner similar to binary CAM cells. For example, during compare operations when TCAM cell 700 stores a "0" or a "1," if the comparand bit C matches the data bit D stored in data cell 710, then compare circuit 730 does not discharge the match line ML, which remains in its pre-charged state to indicate the match condition. Conversely, if the comparand bit C does not match the data bit D, then compare circuit 730 discharges the match line ML (e.g., toward ground potential) to indicate the mismatch condition. To store a don't care state, an active mask bit is stored in mask cell 720 to prevent compare circuit 730 from discharging the match line ML, regardless of the values of D and C.

In accordance with the present embodiments, compare circuit 730 includes two NMOS match line pull-down transistors 733A and 733B, two PMOS pass transistors 731A and 731B, two NMOS gating transistors 732A and 732B, and an NMOS mask discharge transistor 735. The mask transistor 735 is controlled by the mask cell 720. A first group of transistors 731A, 732A, and 733A forms a first selective pull-down circuit 740A that selectively discharges the match line ML in response to a comparison between the comparand bit C provided on CL and the data bit D stored in the data cell 710, and a second group of transistors 731B, 732B, and 733B forms a second selective pull-down circuit 740B that selectively discharges the match line ML in response to a comparison between the complemented comparand bit $\overline{C}$ provided on CLB and the complemented data bit $\overline{D}$.

More specifically, for the first selective pull-down circuit 740A, the NMOS match line pull-down transistor 733A is coupled between the match line ML and the discharge transistor 735, and has a gate tied to a first node (Na) that selectively receives the data bit D via PMOS pass transistor 731A in response to the comparand bit C. Thus, the gate of match line pull-down transistor 733A is selectively driven by D in response to C. The NMOS gating transistor 732A is coupled between the gate of match line pull-down transistor 733A (e.g., node Na) and ground potential. The common gates of transistors 731A and 732A are coupled to the comparand line CL, and receive the comparand bit C during compare operations.

For the second selective pull-down circuit 740B, the NMOS match line pull-down transistor 733B is coupled between the match line and the discharge transistor 735, and has a gate tied to a second node (Nb) that selectively receives $\overline{D}$ via the PMOS pass transistor 731B in response to $\overline{C}$. Thus, the gate of match line pull-down transistor 733B is selectively driven by $\overline{D}$ in response to $\overline{C}$. The NMOS gating transistor 732B is coupled between the gate of match line pull-down transistor 733B (e.g., node Nb) and ground potential. The common gates of transistors 731B and 732B are coupled to the complementary comparand line CLB, and receive the complemented comparand bit $\overline{C}$ during compare operations. The NMOS mask discharge transistor 735 is coupled between the common sources of transistors 733A-733B and ground potential, and has a gate coupled to one side of the mask cell 720 (e.g., to the side that provides the complement of the value of the mask bit stored in the mask cell).

If there is a mismatch condition during compare operations, and the mask cell 720 stores an inactive mask bit (e.g., M=0 and $\overline{M}$=1) that turns on mask discharge transistor 735, then the match line ML is discharged low toward ground potential either through a first discharge path formed by transistors 733A and 735 or through a second discharge path formed by transistors 733B and 735. Thus, each discharge path in compare circuit 730 has only two series-connected transistors, as in the case of CAM cell 602 of FIG. 6B and CAM cell 603 of FIG. 6C. However, unlike CAM cells 602 and 603, the complementary data bits (D and $\overline{D}$) and the complementary comparand bits (C and $\overline{C}$) are provided to and processed by compare circuit 730 in a differential manner, which can improve performance over CAM cells 602 and 603 by providing balanced impedances. Therefore, in accordance with present embodiments, the TCAM cell 700 in FIG. 7 incorporates the advantages of differential compare circuitry and a shortened, two-transistor pull-down stack.

An exemplary compare operation between a comparand bit C and a data value D stored in the CAM cell 700 is now described. During a pre-charge phase of the compare operation, the match line ML is pre-charged to logic high (e.g., towards VDD) by a suitable pre-charge circuit (not shown for simplicity), and the comparand lines CL/CLB are both pre-charged to logic high (e.g., towards VDD). The logic high state of CL turns on NMOS transistor 732A and turns off PMOS transistor 731A. The conductive state of transistor 732A pulls the gate of match line pull-down transistor 733A (e.g., at node Na) low towards ground potential, thereby maintaining transistor 733A in a non-conductive state to isolate the match line ML from ground potential. The non-conductive state of transistor 731A isolates the data cell 710 from node Na, thereby preventing the value of D from being pulled low to ground potential by the conductive NMOS transistor 732A. Similarly, the logic high state of CLB turns on NMOS transistor 732B and turns off PMOS transistor 731B. The conductive state of transistor 732B pulls the gate of match line pull-down transistor 733B (e.g., at node Nb) low towards ground potential, thereby maintaining transistor 733B in a non-conductive state to isolate the match line ML from ground potential. The non-conductive state of transistor 731B isolates the data cell 710 from node Nb, thereby preventing the value of $\overline{D}$ from being pulled low towards ground potential by the conductive NMOS transistor 732B.

Then, during an evaluation phase of the compare operation, the comparand bit C is provided in a complementary manner to the TCAM cell 700 via comparand lines CL and CLB. For this example, the mask bit M is set to an inactive state (e.g., M=0 and $\overline{M}$=1), thereby turning on mask discharge transistor 735 so that the match line pull-down transistors 733A and 733B can selectively pull the match line ML to ground potential in response to the compare operation. If a comparand line is driven to logic high, then the corresponding selective pull-down circuit 740 is disabled and does not discharge the match line ML, as described above. Conversely, if a comparand line is driven to logic low, then the corresponding selective pull-down circuit 740 is enabled and selectively discharges the match line ML in response to the corresponding data bit D and the comparand bit C. For example, if CL is driven to logic low (e.g., in response to C=0), the logic low state of CL turns off NMOS transistor 732A and turns on PMOS transistor 731A, thereby allowing the logic state of D to propagate through transistor 731A to node Na and selectively turn on match line pull-down transistor 733A, thereby selectively discharging the match line ML in response to the logic state of D. If both CL and CLB are driven to a logic high (e.g., to achieve a column-masking function), then both selective pull-down circuits 740A and 740B are disabled and together prevent the match line ML from discharging, thereby causing the CAM cell 700 to indicate a match condition on ML irrespective of the data value D.

For one example, if the comparand bit is logic high (e.g., C=1 and $\overline{C}$=0), then CL is driven to logic high and CLB is driven to logic low. The logic high state of CL disables the first selective pull-down circuit 740A (in the manner described above), and prevents the data bit D from affecting the compare operation. The logic low state of CLB enables the second selective pull-down circuit 740B, and allows the complemented data bit $\overline{D}$ stored in the data cell 710 to selectively discharge the match line ML via match line pull-down transistor 733B. Thus, if the data bit is logic high (e.g., D=1), then the logic low value of $\overline{D}$ propagates through pass gate transistor 731B to node Nb. In response thereto, NMOS pull-down transistor 733B does not turn on, and therefore the match line ML remains in its charged state to indicate the match condition between C=1 and D=1.

Conversely, if the data bit is logic low (e.g., D=0), then the logic high value of $\overline{D}$ propagates through pass gate transistor 731B to node Nb. In response thereto, NMOS pull-down transistor 733B turns on and discharges the match line ML low toward ground potential to indicate the mismatch condition between C=1 and D=0.

The TCAM cell 700 also operates in a complementary manner for compare operations in which the comparand bit is logic low (e.g., C=0 and $\overline{C}$=1). More specifically, the logic low state of CL enables selective pull-down circuit 740A (in the manner described above), and allows the data bit D to selectively discharge the match line ML. The logic high state of CLB disables selective pull-down circuit 740B (in the manner described above), and prevents the complemented data bit $\overline{D}$ from affecting the compare operation. Thus, if the data bit is logic low (e.g., D=0), then the logic low value of D propagates through pass transistor 731A to node Na. In response thereto, NMOS pull-down transistor 733A does not turn on, and therefore the match line ML remains in its charged state to indicate the match condition between C=0 and D=0. Conversely, if the data bit is logic high (e.g., D=1), then the logic high value of D propagates through pass transistor 731A to node Na. In response thereto, NMOS pull-down transistor 733A turns on and discharges the match line ML low toward ground potential to indicate the mismatch condition between C=0 and D=1.

In accordance with the present embodiments, the compare circuit 730 of TCAM cell 700 includes only two transistors (e.g., transistors 733 and 735) in each pull-down path between the match line and ground potential, as shown in FIG. 7. In contrast, the TCAM cell 601 of FIG. 6A includes three series-connected transistors (e.g., transistors 631, 632, and 633) in each pull-down path between the match line and ground potential. As a result, the TCAM cell 700 of present embodiments is faster than the TCAM cell 601 of FIG. 6A. More specifically, because the compare circuit 730 employs double stack pull-down elements (e.g., transistors 733 and 735) between the match line and ground potential, the TCAM cell 700 puts less pull-down resistance and less capacitive loading on the match line than the 3-stack pull-down elements (e.g., transistors 631, 632, and 633) employed in the TCAM cell 601, and therefore is faster than TCAM cell 601. Further, because each CAM cell 700 puts less capacitive loading on the match line, a CAM array such as CAM array 210 of FIG. 2 can employ more CAM cells 700 in each row without degrading performance, as compared to CAM cells 601. Further, the reduced match line capacitance resulting from fewer pull-down transistors in the compare stack of CAM cell 700 may reduce power consumption, as compared with TCAM cells 601 of FIG. 6A.

Figure 8:
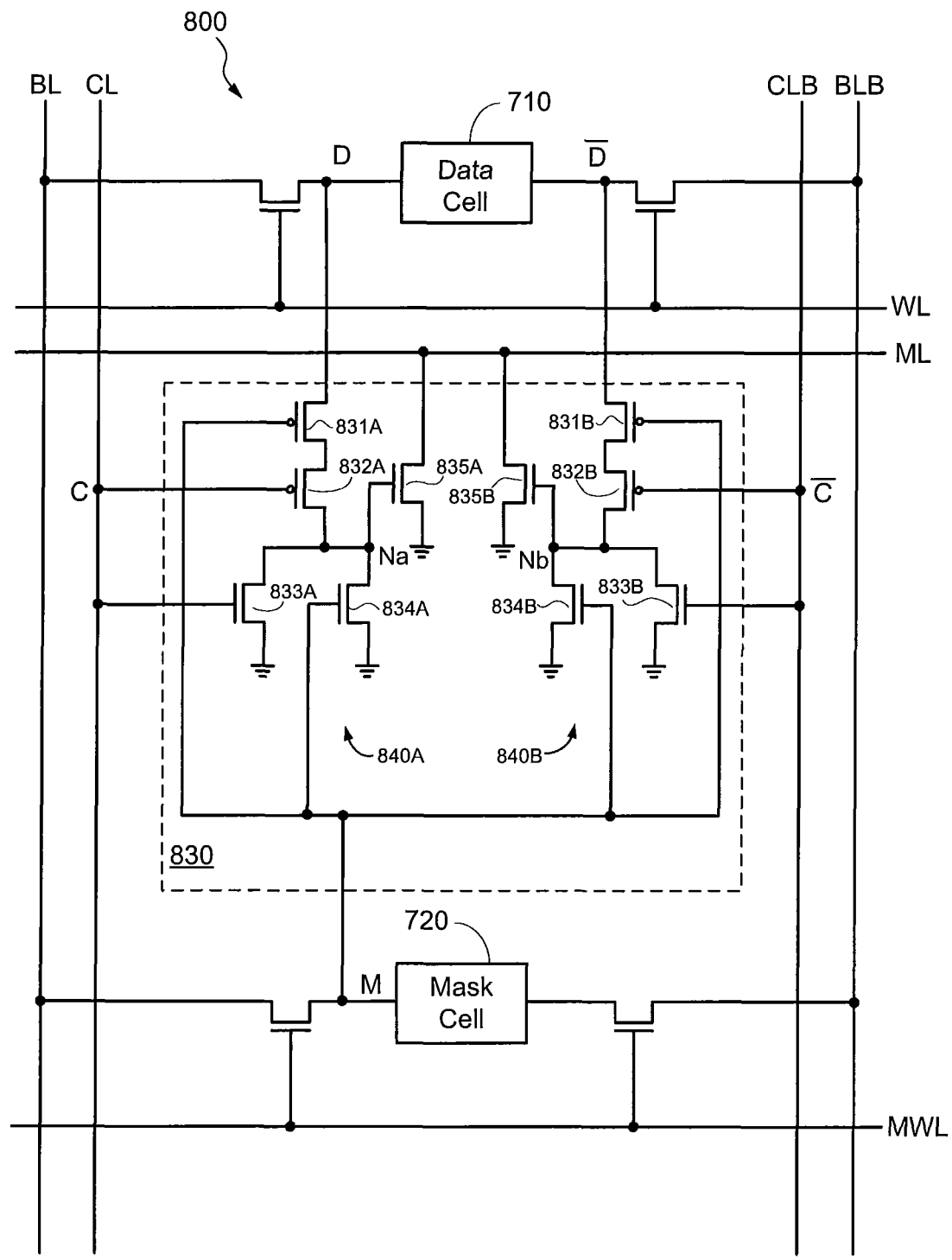
FIG. 8 is a block diagram of a TCAM cell according to other embodiments.

FIG. 8 is a block diagram of a TCAM cell 800 in accordance with other embodiments. TCAM cell 800 includes data cell 710, mask cell 720, and a compare circuit 830. The complementary data bits (D and $\overline{D}$) stored in data cell 710 are applied to compare circuit 830 in a differential manner. The TCAM cell 800 can store three possible states: "0", "1", or "don't care." To store a don't care state, an active mask bit (M=1) is stored in mask cell 720 to turn on mask discharge transistors 834A and 834B, which in turn pull the gates of respective match line pull-down transistors 835A and 835B low towards ground potential, thereby preventing match line pull-down transistors 835A and 835B from turning on and discharging the match line ML. Conversely, when mask cell 720 stores an inactive mask bit (M=0), mask discharge transistors 834A and 834B are turned off and allow a comparison between D and C to proceed and affect the match line ML. Thus, when TCAM cell 800 stores a "0" or a "1," TCAM cell 800 operates in a manner similar to binary CAM cells. For example, during compare operations, if the comparand bit C matches the data bit D stored in data cell 710, then compare circuit 830 does not discharge the match line ML, which remains in its pre-charged state to indicate the match condition. Conversely, if the comparand bit C does not match the data bit D, then compare circuit 830 discharges the match line ML (e.g., toward ground potential) to indicate the mismatch condition.

In accordance with the present embodiment, the compare circuit 830 includes two NMOS match line pull-down transistors 835A and 835B, four PMOS pass transistors 831A, 832A, 831B, and 832B, and four NMOS gating transistors 833A, 834A, 833B, and 834B. A first group of transistors 831A, 832A, 833A, 834A, and 835A forms a first selective pull-down circuit 840A that selectively discharges the match line ML in response to a comparison between the comparand bit C provided on CL and the data bit (D) stored in the data cell 710, and a second group of transistors 831B, 832B, 833B, 834B, and 835B forms a second selective pull-down circuit 840B that selectively discharges the match line ML in response to a comparison between the complemented comparand bit ($\overline{C}$) provided on CLB and the complemented data bit ($\overline{D}$) stored in the data cell 710. Optionally, the mask cell 720 can be configured to disable the compare circuit 830 and prevent the match line ML from discharging. In this manner, the data value D stored in data cell 710 is masked from the compare operation, thereby forcing a match condition for the CAM cell 800, regardless of the comparand data.

More specifically, for the first selective pull-down circuit 840A, the NMOS match line pull-down transistor 835A is coupled between the match line ML and ground potential, and has a gate tied to a first node (Na) that selectively receives D from the data cell 710 via series-connected PMOS pass transistors 831A and 832A. NMOS gating transistors 833A and 834A are connected in parallel between the gate of match line pull-down transistor 835A (at node Na) and ground potential. The first pass transistor 832A and the first gating transistor 833A have gates coupled to the comparand line CL, and receive the comparand bit C during compare operations. The second pass transistor 831A and the second gating transistor 834A have gates coupled to the mask cell 720 and receive the mask bit M during compare operations. Thus, as explained in more detail below, the gate of the first match line pull-down transistor 835A is responsive to a logical combination of the data bit D, the mask bit M, and the comparand bit C.

For the second selective pull-down circuit 840B, the NMOS match line pull-down transistor 835B is coupled between the match line ML and ground potential, and has a gate tied to a second node (Nb) that selectively receives $\overline{D}$ from the data cell 710 via series-connected PMOS pass transistors 831B and 832B. NMOS gating transistors 833B and 834B are connected in parallel between the gate of match line pull-down transistor 835B (at node Nb) and ground potential. The third pass transistor 832B and the third gating transistor 833B have gates coupled to the complementary comparand line CLB, and receive the complemented comparand bit $\overline{C}$ during compare operations. The fourth pass transistor 831B and the fourth gating transistor 834B have gates coupled to the mask cell 720 and receive M during compare operations. Thus, as explained in more detail below, the gate of the second match line pull-down transistor 835B is responsive to a logical combination of the complemented data bit $\overline{D}$, the mask bit M, and the complemented comparand bit $\overline{C}$.

In general, when a mismatch condition occurs between the data bit D and the comparand bit C in the TCAM cell 800, the match line ML is discharged through either pull-down transistor 835A or pull-down transistor 835B. Therefore, according to present embodiments, the TCAM cell 800 of FIG. 8 incorporates both advantages of differential circuitry and a shortened, one-transistor pull-down path. Note that while CAM cell 700 in FIG. 7 has a lower overall transistor count in its compare circuit 730, CAM cell 800 in FIG. 8 has a shorter, one-transistor pull-down path in its compare circuit 830.

An exemplary compare operation between a comparand bit C and a data value D stored in the CAM cell 800 is now described. During a pre-charge phase of the compare operation, the match line ML is pre-charged to logic high (e.g., towards VDD) by a suitable pre-charge circuit (not shown for simplicity), and the comparand lines CL/CLB are both pre-charged to logic high (e.g., towards VDD), which in turn disable corresponding selective pull-down circuits 840A and 840B. The logic high state of CL turns on NMOS transistor 833A and turns off PMOS transistor 832A. The conductive state of transistor 833A pulls the gate of match line pull-down transistor 835A (e.g., at node Na) low towards ground potential, thereby maintaining transistor 835A in a non-conductive state to isolate the match line ML from ground potential. The non-conductive state of transistor 832A isolates the data cell 710 from node Na, thereby preventing the value of D from being pulled low to ground potential by the conductive NMOS transistor 833A. Similarly, the logic high state of CLB turns on NMOS transistor 833B and turns off PMOS transistor 832B. The conductive state of transistor 833B pulls the gate of match line pull-down transistor 835B (e.g., at node Nb) low towards ground potential, thereby maintaining transistor 835B in a non-conductive state to isolate the match line ML from ground potential. The non-conductive state of transistor 832B isolates the data cell 710 from node Nb, thereby preventing the value of $\overline{D}$ from being pulled low to ground potential by the conductive NMOS transistor 833B.

Then, during an evaluation phase of the compare operation, the comparand bit C is provided in a complementary manner to the TCAM cell 800 via comparand lines CL and CLB. For this example, the mask cell 720 stores an "inactive" mask bit (e.g., M=0), which turns off both mask discharge transistors 834A and 834B and turns on both pass transistors 831A and 831B. If a comparand line is driven to logic high, then the corresponding selective pull-down circuit 840 is disabled and does not discharge the match line ML. Conversely, if a comparand line is driven to logic low, then the corresponding selective pull-down circuit 840 is enabled and selectively discharges the match line ML in response to the comparison between the data bit D and the comparand bit C. If both CL and CLB are driven to a logic high (e.g., to achieve a column-masking function), then both selective pull-down circuits 840A and 840B are disabled and together prevent the match line ML from discharging, thereby causing the CAM cell 800 to indicate a match condition on ML irrespective of the data value D.

For one example, if the comparand bit is logic high (e.g., C=1 and $\overline{C}$=0), then CL is driven to logic high and CLB is driven to logic low. The logic high state of CL disables the first selective pull-down circuit 840A (in the manner described above), and prevents the data bit D from affecting the compare operation. The logic low state of CLB enables the second selective pull-down circuit 840B, thereby allowing the complemented data bit $\overline{D}$ to selectively discharge the match line ML. More specifically, the logic low state of CLB turns on PMOS transistor 832B and turns off NMOS transistor 833B. The conductive state of transistor 832B allows $\overline{D}$ to propagate to second node Nb, and the non-conductive state of transistor 833B isolates node Nb from the ground potential. Thus, if the data bit is logic high (e.g., D=1 and $\overline{D}$=0), then the logic low value of $\overline{D}$ propagates through pass gate transistors 831B and 832B to node Nb. In response thereto, NMOS pull-down transistor 835B does not turn on, and therefore the match line ML remains in its charged state to indicate the match condition between C=1 and D=1.

Conversely, if the data bit is logic low (e.g., D=0 and $\overline{D}$=1), then the logic high value of $\overline{D}$ propagates through pass transistors 831B and 832B to node Nb. In response thereto, NMOS pull-down transistor 835B turns on and discharges the match line ML low toward ground potential to indicate the mismatch condition between C=1 and D=0.

The TCAM cell 800 operates in a complementary manner for compare operations in which the comparand bit is logic low (e.g., C=0 and $\overline{C}$=1). More specifically, the logic low state of CL enables the first selective pull-down circuit 840A, thereby allowing the data bit D to selectively discharge the match line ML. The logic high state of CLB disables the second selective pull-down circuit 840B, and prevents the complemented data bit $\overline{D}$ from affecting the compare operation. Thus, if the data bit is logic low (e.g., D=0), then the logic low value of D propagates through pass transistors 831A and 832A to node Na. In response thereto, NMOS pull-down transistor 835A does not turn on, and therefore the match line ML remains in its charged state to indicate the match condition between C=0 and D=0. Conversely, if the data bit is logic high (e.g., D=1 and $\overline{D}$=0), then the logic high value of D propagates through pass transistors 831A and 832A to node Na. In response thereto, NMOS pull-down transistor 835A turns on and discharges the match line ML low toward ground potential to indicate the mismatch condition between C=0 and D=1.

In accordance with the present embodiments, the compare circuit 830 of TCAM cell 800 includes only one transistor (e.g., transistor 835) in each pull-down path between the match line and ground potential, as shown in FIG. 8. In contrast, the TCAM cell 601 of FIG. 6A includes three series-connected transistors (e.g., transistors 631-632-633) in each pull-down path between the match line and ground potential, and the TCAM cells 602 and 603 of FIG. 6B and FIG. 6C, respectively, each include two series-connected transistors (e.g., transistors 642-643 in FIG. 6B, and transistors 651-652A or transistors 653-652B in FIG. 6C) in each pull-down path between the match line and ground potential. As a result, the TCAM cell 800 of FIG. 8 is faster than the TCAM cell 601-603. More specifically, because the compare circuit 830 employs single stack pull-down elements (e.g., transistor 835) between the match line and ground potential, the TCAM cell 800 puts less pull-down resistance and less capacitive loading on the match line than the 3-stack or 2-stack pull-down elements employed in other TCAM cells, and therefore is faster than such other TCAM cells. Further, because each CAM cell 800 puts less capacitive loading on the match line, a CAM array such as CAM array 210 of FIG. 2 can employ more CAM cells 800 in each row without degrading performance, as compared to CAM cells 601-603. Further, the reduced match line capacitance resulting from fewer pull-down transistors in the compare stack of CAM cell 800 may reduce power consumption, as compared with TCAM cells 601-603.

Figures 9A, 9B:
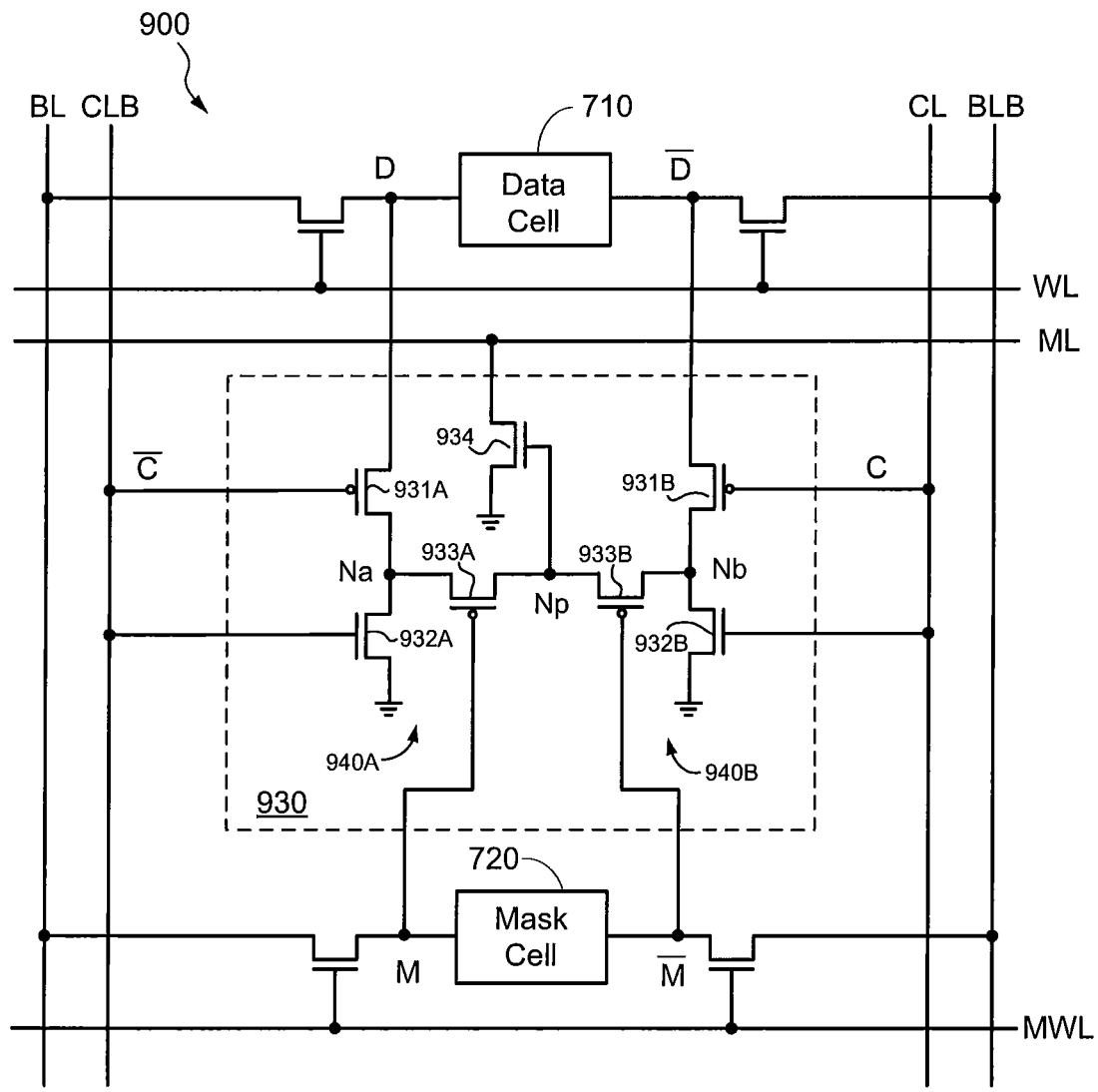
FIG. 9A is a block diagram of a TCAM cell that incorporates an XY encoding technique in accordance with some embodiments.
FIG. 9B shows a truth table for data storage and match conditions of the TCAM cell of FIG. 9A.

FIG. 9A is a block diagram of a TCAM cell 900 that incorporates an XY encoding technique in accordance with some embodiments. TCAM cell 900 includes a data cell 710, a mask cell 720, and a compare circuit 930. The data stored in the data cell 710 is applied to a compare circuit 930 in a differential manner as D and $\overline{D}$. The mask bit stored in the mask cell 720 is also applied to the compare circuit 930 in a differential manner as M and $\overline{M}$. The mask cell 720 can be configured, together with the data cell 710, to disable the compare circuit 930 from discharging a match line ML, leaving the match line ML always logic high. Thus, the TCAM cell 900 can be configured to store three possible states: "0", "1", or "don't care," as depicted in the truth table 950 of FIG. 9B. For example, when the TCAM cell 900 stores a "0" or a "1," the TCAM cell 900 operates as a binary CAM cell. When the mask cell 720 and the data cell 710 store the same logic value (e.g., both "0" or both "1), the TCAM cell 900 stores a "don't care" value and indicates a match condition regardless of the comparand data applied to the TCAM cell.

In accordance with the present embodiments, the compare circuit 930 includes a single match line pull-down transistor 934, two pass transistors 931A and 931B, two gating transistors 932A and 932B, and two control transistors 933A and 933B. A first group of transistors 931A, 932A, and 933A forms a first selective pull-down control circuit 940A that controls the match line pull-down transistor 934 and selectively discharges the match line ML in response to a comparison between the complemented comparand bit ($\overline{C}$) provided on CLB, the data bit (D) stored in the data cell 710, and the mask bit (M) stored in the mask cell 720. A second group of transistors 931B, 932B, and 933B forms a second selective pull-down control circuit 940B that controls the match line pull-down transistor 934 and selectively discharges the match line ML in response to a comparison between the comparand bit (C) provided on CL, the complemented data bit ($\overline{D}$) stored in the data cell 710, and the complemented mask bit ($\overline{M}$) stored in the mask cell 720. Optionally, the mask cell 720 and the data cell 710 can together be configured to disable the compare circuit 930 and prevent the match line ML from discharging. In this manner, the data value stored in CAM cell 900 is masked from the compare operation, thereby forcing a match condition for the CAM cell 900, regardless of the comparand data.

More specifically, the NMOS match line pull-down transistor 934 is coupled between the match line ML and ground potential, and has a gate tied to a pull-down or discharge node (Np) that selectively receives control signals from match line pull-down control circuits 940A and 940B. For the first selective pull-down control circuit 940A, the PMOS control transistor 933A is coupled between the pull-down node Np and a first node (Na), and has a gate to receive the mask bit M from mask cell 720. The NMOS gating transistor 932A is coupled between ground potential and the first node Na, which in turn selectively receives D from data cell 710 via PMOS pass transistor 931A. PMOS pass transistor 931A and NMOS gating transistor 932A are connected in series, and have gates coupled to the complementary comparand line CLB. For the second selective pull-down control circuit 940B, PMOS control transistor 933B is coupled between the pull-down node Np and a second node (Nb), and has a gate to receive the complemented mask bit $\overline{M}$ from mask cell 720. The NMOS gating transistor 932B is coupled between ground potential and the second node Nb, which in turn selectively receives $\overline{D}$ from data cell 710 via PMOS pass transistor 931B. PMOS pass transistor 931B and NMOS gating transistor 932B are connected in series, and have gates coupled to the complementary comparand line CL. Thus, as explained in more detail below, the gate of the single match line pull-down transistor 934 is responsive to (1) a logical combination of the data bit D, the mask bit M, and the complemented comparand bit $\overline{C}$, and (2) a logical combination of the complemented data bit $\overline{D}$, the complemented mask bit $\overline{M}$, and the comparand bit C.

When a match condition occurs, the match line ML is discharged through a single match line pull-down transistor 934. Therefore, according to the present embodiments, TCAM cell 900 of FIG. 9A incorporates both advantages of differential compare circuitry and a shortened, one-transistor pull-down path. It is further observed that the CAM cell 900 in FIG. 9A has the same, reduced overall transistor count in its compare circuit 930 as the compare circuit 730 of CAM cell 700 in FIG. 7.

For other embodiments, PMOS control transistors 933A and 933B can be NMOS transistors, in which case the gate of transistor 933A receives $\overline{M}$ and the gate of transistor 933B receives M.

An exemplary compare operation between a comparand bit C and a data value (represented by the data bit D and the mask bit M, as illustrated in FIG. 9B) stored in the CAM cell 900 is now described. During a pre-charge phase of the compare operation, the match line ML is pre-charged to logic high (e.g., towards VDD) by a suitable pre-charge circuit (not shown for simplicity), and the comparand lines CL/CLB are both pre-charged to logic high (e.g., towards VDD). The logic high state of CL turns on NMOS transistor 932B and turns off PMOS transistor 931B, thereby pulling node Nb low to ground potential. Therefore, although one of the control transistors 933A and 933B may be turned on because of the complementary mask bit M and $\overline{M}$, in the case that 933B is turned on, the conductive state of transistor 933B pulls the gate of match line pull-down transistor 934 (e.g., at node Np) low towards ground potential, thereby maintaining transistor 934 in a non-conductive state to isolate the match line ML from ground potential. The non-conductive state of transistor 931B isolates the data cell 710 from node Nb, thereby preventing the value of $\overline{D}$ from being pulled low to ground potential by the conductive NMOS transistor 932B.

Similarly, the logic high state of CLB turns on NMOS transistor 932A and turns off PMOS transistor 931A, thereby pulling node Na low to ground potential. Therefore, although one of the control transistors 933A and 933B may be turned on because of the complementary mask bit M and $\overline{M}$, in the case that 933A is turned on, the conductive state of transistor 933A pulls the gate of match line pull-down transistor 934 (e.g., at node Np) low towards ground potential, thereby maintaining transistor 934 in a non-conductive state to isolate the match line ML from ground potential. The non-conductive state of transistor 931A isolates the data cell 710 from node Na, thereby preventing the value of D from being pulled low to ground potential by the conductive NMOS transistor 932A.

Then, during an evaluation phase of the compare operation, the comparand bit C is provided in a complementary manner to the TCAM cell 900 via comparand lines CL and CLB. For this example, the mask cell 720 and the data cell 710 store either a logic 0 or a logic 1 value. For one example, if the comparand bit is logic high (e.g., C=1 and $\overline{C}$=0), then CL is driven to logic high and CLB is driven to logic low. The logic high state of CL turns off pass transistor 931B and turns on gating transistor 932B of the second selective pull-down control circuit 940B, thereby preventing the complemented data bit $\overline{D}$ from affecting the compare operation. The logic low state of CLB turns off gating transistor 932A and turns on pass transistor 931A of the first selective pull-down control circuit 940A, thereby allowing the data bit D, the mask bit M, and the complemented mask bit $\overline{M}$ to selectively discharge the match line ML. Thus, if the data value is logic high (e.g., D=0 and M=1, as in rows 961 and 965 of FIG. 9B), the logic low value of $\overline{M}$ turns on control transistor 933B, which pulls the logic state of the pull-down node Np low to ground potential via gating transistor 932B. In response thereto, NMOS pull-down transistor 934 does not turn on, and therefore the match line ML remains in its charged state to indicate the match condition between C=1 and a data value of 1. The logic high state of M turns off control transistor 933A, and preserves the logic state of the data bit D.

Conversely, if the data bit is logic low (e.g., D=1 and M=0, as in rows 962 and 966 of FIG. 9B), then the logic high value of D propagates through pass transistor 931A to node Na. The logic low value of M turns on control transistor 933A, so that the logic high value of D propagates to the pull-down node Np. In response thereto, NMOS pull-down transistor 934 turns on and discharges the match line ML low toward ground potential to indicate the mismatch condition between C=1 and data value of 0. The logic high state of $\overline{M}$ turns off control transistor 933B to prevent the pull-down node Np from being pulled low to ground potential by gating transistor 932B.

The TCAM cell 900 operates in a complementary manner for compare operations in which the comparand bit is logic low (e.g., C=0 and $\overline{C}$=1), where CL is driven to logic low and CLB is driven to logic high. More specifically, the logic high state of CLB turns off pass transistor 931A and turns on gating transistor 932A of the first selective pull-down control circuit 940A, thereby preventing the data bit D from affecting the compare operation. The logic low state of CL turns off gating transistor 932B and turns on pass transistor 931B of the second selective pull-down control circuit 940B, thereby allowing the complemented data bit $\overline{D}$, the mask bit M, and the complemented mask bit $\overline{M}$ to selectively discharge the match line ML. Thus, if the data value is logic low (e.g., D=1 and M=0, as in rows 962 and 966 of FIG. 9B), the logic low value of M turns on control transistor 933A, and pulls the pull-down node Np low to ground potential via gating transistor 932A. In response thereto, NMOS pull-down transistor 934 does not turn on, and therefore the match line ML remains in its charged state to indicate the match condition between C=0 and the data value of 0. The logic high state of $\overline{M}$ turns off control transistor 933B, and preserves the logic state of the complemented data bit $\overline{D}$.

Conversely, if the data value is logic high (e.g., D=0 and M=1, as in row 961 and 965 of FIG. 9B), then the logic high value of $\overline{D}$ propagates through pass gate transistor 931B to the node Nb. The logic low value of $\overline{M}$ turns on control transistor 933B, so that the logic high value of $\overline{D}$ propagates to the pull-down node Np. In response thereto, NMOS pull-down transistor 934 turns on and discharges the match line ML low toward ground potential to indicate the mismatch condition between C=0 and data value of 1. The logic high state of M turns off control transistor 933A to prevent node Np from being pulled low to ground potential by gating transistor 932A.

To indicate the "don't care" state in TCAM cell 900, mask cell 720 and data cell 710 store the same logic value. For example, when mask cell 720 and data cell 710 both store a "1," (e.g., D=1 and $\overline{D}$=0; M=1 and $\overline{M}$=0), the mask bit M disables the first selective pull-down control circuit 940A by turning off control transistor 933A, and the complemented mask bit $\overline{M}$ enables the second selective pull-down control circuit 940B by turning on control transistor 933B. Therefore, if the comparand bit C is logic high, pass transistor 931B turns off and gating transistor 932B turns on, which in turn pulls the gate of the match line pull-down transistor 934 (e.g., at node Np) low to ground potential, thereby turning off pull-down transistor 934 and forcing a match condition. Conversely, if the comparand bit C is logic low, gating transistor 932B turns off and pass transistor 931B turns on, which in turn allows the logic low state of $\overline{D}$ to pull the gate of the match line pull-down transistor 934 (e.g., at node Np) low to ground potential, thereby turning off pull-down transistor 934 and forcing a match condition.

Similarly, when mask cell 720 and data cell 710 both store a "0," (e.g., D=0 and $\overline{D}$=1; M=0 and $\overline{M}$=1), the mask bit M enables the first selective pull-down control circuit 940A by turning on control transistor 933A, and the complemented mask bit $\overline{M}$ disables the second selective pull-down control circuit 940B by turning off control transistor 933B. Therefore, if the complemented comparand bit $\overline{C}$ is logic high, pass transistor 931A turns off and gating transistor 932A turns on, which in turn pulls the gate of the match line pull-down transistor 934 (e.g., at node Np) low to ground potential, thereby turning off pull-down transistor 934 and forcing a match condition. Conversely, if the complemented comparand bit $\overline{C}$ is logic low, gating transistor 932A turns off and pass transistor 931A turns on, which in turn allows the logic low state of D to pull the gate of the match line pull-down transistor 934 (e.g., at node Np) low to ground potential, thereby turning off pull-down transistor 934 and forcing a match condition. In this manner, CAM cell 900 indicates a match regardless of the value of the comparand data applied when data cell 710 and mask cell 720 both store the same value.

Note that if both CL and CLB are driven to a logic high (e.g., to achieve a column-masking function), then both selective pull-down control circuits 940A and 940B are disabled and together prevent the match line ML from discharging by maintaining match line pull-down transistor 934 in a non-conductive state, thereby causing the CAM cell 900 to indicate a match condition on ML irrespective of the data value D or the mask bit M.

In accordance with the present embodiments, the compare circuit 930 of TCAM cell 900 includes only one transistor (e.g., transistor 934) in the pull-down path between the match line and ground potential, as shown in FIG. 9A. In contrast, the TCAM cell 601 of FIG. 6A includes three series-connected transistors (e.g., transistors 631-632-633) in each pull-down path between the match line and ground potential, and the TCAM cells 602 and 603 of FIG. 6B and FIG. 6C include two series-connected transistors (e.g., transistors 642-643 in FIG. 6B, and transistors 651-652A or transistors 653-652B in FIG. 6C) in each pull-down path between the match line and ground potential. Accordingly, the TCAM cell 900 of present embodiments is faster than the TCAM cells 601-603. More specifically, because the compare circuit 930 employs single stack pull-down elements (e.g., transistor 934) between the match line and ground potential, the TCAM cell 900 puts less pull-down resistance and less capacitive loading on the match line than the 3-stack or 2-stack pull-down elements employed in the TCAM cells 601-603, and therefore is faster than TCAM cells 601-603. In addition, CAM cell 900 advantageously includes only one pull-down path between match line ML and ground potential (e.g., through transistor 934), which also reduces match line capacitance compared to CAM cells (such as CAM cells 601-603) that each include two pull-down paths between the match line and ground potential. Further, because each CAM cell 900 puts less capacitive loading on the match line, a CAM array such as CAM array 210 of FIG. 2 can employ more CAM cells 900 in each row without degrading performance, as compared to CAM cells 601-603. Further, the reduced match line capacitance resulting from fewer pull-down transistors in the compare stack of CAM cell 900 may reduce power consumption, as compared with TCAM cells 601-603.

Figures 10A, 10B:
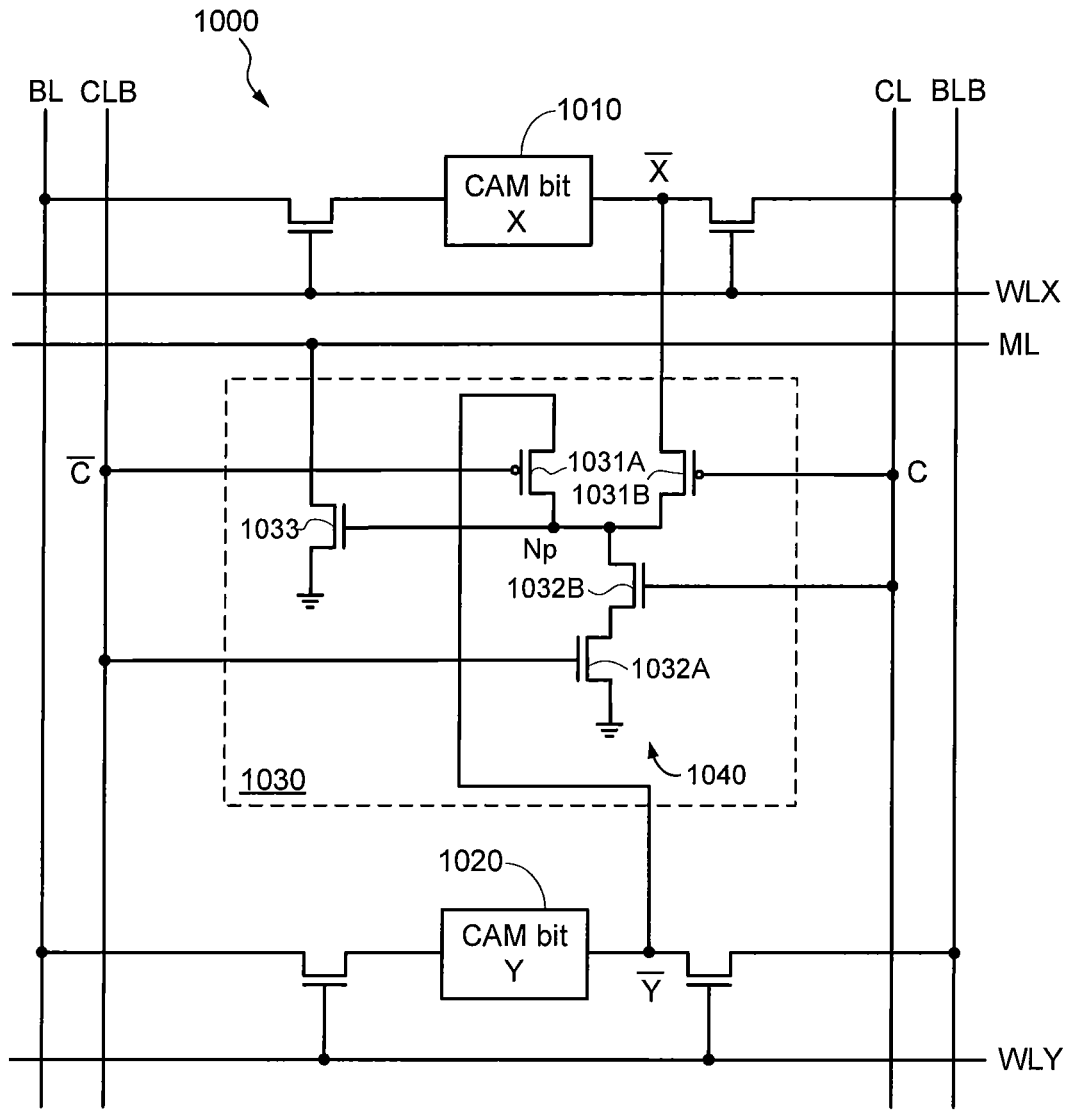
FIG. 10A is a block diagram of an XY CAM cell according to some embodiments.
FIG. 10B shows a truth table for data storage of the XY CAM cell of FIG. 10A.

FIG. 10A shows a quaternary (XY) CAM cell 1000 in accordance with other embodiments. The XY CAM cell 1000 includes two memory cells 1010 and 1020 coupled to a compare circuit 1030. The memory cells 1010 and 1020 can be any suitable type of storage cell including, for example, an SRAM cell, a DRAM cell, an EEPROM cell, a flash memory cell, a latch, or a register. For some embodiments, memory cells 1010 and 1020 are formed using cross-coupled CMOS inverter circuits. The first memory cell 1010 stores a first data bit "X", and the second memory cell 1020 stores a second data bit "Y". Together, the two data bits X and Y can collectively represent a data value (D) having four possible states: "0", "1", "don't care", and a fourth state which may be left unused or may indicate "invalid," as depicted in the truth table 1050 of FIG. 10B.

More specifically, the logic "0" and "1" states correspond to the logic states represented by a conventional binary CAM cell. For each of these states, if the comparand data (e.g., provided to CAM cell 1000 via complementary comparand lines CL and CLB) matches the data value stored in CAM cell 1000, the compare circuit 1030 does not discharge the match line ML, which remains in its charged state to indicate a match condition. Conversely, if the comparand data does not match the data value stored in CAM cell 1000, compare circuit 1030 discharges match line ML (e.g., toward ground potential) to indicate the mismatch condition. For the "don't care" state, the logic high values of X and Y cause compare circuit 1030 to remain in a non-conductive state, thereby preventing the match line ML from discharging. In this manner, the data value stored in CAM cell 1000 is masked from the compare operation, thereby forcing a match condition for CAM cell 1000, regardless of the comparand data. For the "invalid" state, the logic low values of X and Y cause compare circuit 1030 to remain in a conductive state and discharge the match line ML to indicate a mismatch condition, irrespective of the comparand data. For some embodiments, the "invalid" state can be used to disable a row of the CAM array containing one or more XY CAM cells 1000, for example, as described in commonly-owned U.S. Pat. No. 6,865,098, which is incorporated by reference herein as above mentioned.

The first memory cell 1010 can be accessed for read and write operations by asserting its corresponding word line (WLX) to logic high and then driving the complementary bit lines BL and ($\overline{BL}$) to suitable opposite logic states. Similarly, the second memory cell 1020 can be accessed for read and write operations by asserting its corresponding word line (WLY) to logic high and then driving the complementary bit lines BL and ($\overline{BL}$) to suitable opposite logic states.

The compare circuit 1030 includes one NMOS match line pull-down transistor 1033, two PMOS pass transistors 1031A and 1031B, and two NMOS gating transistors 1032A and 1032B. A first group of transistors 1031A and 1032A forms a first selective pull-down circuit that controls the match line pull-down transistor 1033 to selectively discharge the match line ML in response to a comparison between the complemented comparand bit ($\overline{C}$) provided on CLB and the second data bit Y, and a second group of transistors 1031B and 1032B forms a second selective pull-down circuit that controls the match line pull-down transistor 1033 to selectively discharge the match line ML in response to a comparison between the comparand bit (C) provided on CL and the first data bit X. Together, first selective pull-down circuit and second selective pull-down circuit form a match line pull-down control logic 1040.

More specifically, the match line pull-down transistor 1033 is coupled between match line ML and ground potential, and has a gate coupled to a pull-down node (Np) that receives signals from the match line pull-down control logic 1040. For the match line pull-down control logic 1040, the first pass transistor 1031A is coupled between the pull-down node Np and second memory cell 1020 to receive the complemented second data bit $\overline{Y}$, and has a gate to receive the complemented comparand bit $\overline{C}$ from CLB during compare operations. The pass transistor 1031B is coupled between the pull-down node Np and first memory cell 1010 to receive the complemented first data bit $\overline{X}$, and has a gate to receive the comparand bit C from CL during compare operations. The two gating transistors 1032A and 1032B are connected in series between the pull-down node Np and ground potential. The gate of transistor 1032A is coupled to CLB and receives the complemented comparand bit $\overline{C}$ during compare operations, and the gate of transistor 1032B is coupled to CL and receives the comparand bit C during compare operations.

For other embodiments, the comparand lines CL and CLB can be reversed, which in turn reverses the polarity of compare operations. Similarly, for other embodiments, compare circuit 1030 can receive the bit values X and Y from the respective memory cells 1010 and 1020 (instead of receiving X and Y), in which case the positions of data value "invalid" and "don't care" in table 1050 are reversed.

An exemplary compare operation between a comparand bit C and the data value D stored in the CAM cell 1000 is now described. During a pre-charge phase of the compare operation, the match line ML is pre-charged to logic high (e.g., towards VDD) by a suitable pre-charge circuit (not shown for simplicity), and the comparand lines CL/CLB are both pre-charged to logic high (e.g., towards VDD). The logic high state of CLB turns on NMOS transistor 1032A and turns off PMOS transistor 1031A. The logic high state of CL turns on NMOS transistor 1032B and turns off PMOS transistor 1031B. The conductive states of transistors 1032A and 1032B pull the gate of match line pull-down transistor 1033 (e.g., at pull-down node Np) low towards ground potential, thereby maintaining transistor 1033 in a non-conductive state to isolate the match line ML from ground potential. The non-conductive state of transistor 1031A isolates the second memory cell 1020 from node Np, thereby preventing the value of $\overline{Y}$ from being inadvertently pulled low to ground potential by the conductive NMOS transistors 1032A and 1032B. Similarly, the non-conductive state of transistor 1031B isolates the first memory cell 1010 from node Np, thereby preventing the value of $\overline{X}$ from being inadvertently pulled low to ground potential by the conductive NMOS transistors 1032A and 1032B.

Then, during an evaluation phase of the compare operation, the comparand bit C is provided in a complementary manner to the XY CAM cell 1000 via comparand lines CL and CLB for comparison with the data value D represented by the data bits X and Y. The match line pull-down control logic 1040 selectively turns on match line pull-down transistor 1033 to discharge the match line ML in response to the logic states of the comparand bit C and the stored data value D. If a comparand line is driven to logic high, then the corresponding selective pull-down circuit is disabled and does not allow an associated data bit to affect the compare operation. Conversely, if a comparand line is driven to logic low, then the corresponding selective pull-down circuit is enabled and allows the associated data bit to selectively turn on match line discharge transistor 1033 and thereby discharge the match line ML. If both CL and CLB are driven to logic high (e.g., to achieve a column-masking function), then both selective pull-down circuits are disabled and together prevent the match line ML from discharging, thereby causing the CAM cell 1000 to indicate a match condition on ML irrespective of the data value.

For one example, if the comparand bit is logic high (e.g., C=1 and $\overline{C}$=0), then CL is driven to logic high and CLB is driven to logic low. The logic high state of CL disables the second selective pull-down circuit (in the manner described above), and prevents the $\overline{X}$ bit provided by first memory cell 1010 from affecting the compare operation. The logic low state of CLB enables the first selective pull-down circuit (in the manner described above), and allows the $\overline{Y}$ bit provided by second memory cell 1020 to selectively discharge the match line ML by selectively turning on the match line pull-down transistor 1033. Thus, if the stored data value is logic high (e.g., D=1), as indicated by X=0 and Y=1, then the logic low value ($\overline{Y}$=0) provided by second memory cell 1020 propagates through pass gate transistor 1031A to node Np. In response to $\overline{Y}$=0, NMOS pull-down transistor 1033 does not turn on, and therefore the match line ML remains in its charged state to indicate the match condition between C=1 and D=1. Conversely, if the data value is logic low (e.g., D=0), as indicated by X=1 and Y=0, then the logic high value ($\overline{Y}$=1) provided by second memory cell 1020 propagates through pass gate transistor 1031A to node Np. In response to $\overline{Y}$=1, NMOS pull-down transistor 1033 turns on and discharges the match line ML low toward ground potential to indicate the mismatch condition between C=1 and D=0.

The XY CAM cell 1000 operates in a complementary manner for compare operations in which the comparand bit is logic low (e.g., C=0 and $\overline{C}$=1), where CL is driven to logic low and CLB is driven to logic high. More specifically, the logic low state of CL enables the second selective pull-down circuit (in the manner described above), and allows the $\overline{X}$ bit provided by first memory cell 1010 to selectively discharge the match line ML. The logic high state of CLB disables the first selective pull-down circuit (in the manner described above), and prevents the $\overline{Y}$ bit provided by second memory cell 1020 from affecting the compare operation. Thus, if the data value is logic low (e.g., D=0), as indicated by X=1 and Y=0, then the logic low value ($\overline{X}$=0) provided by first memory cell 1010 propagates through pass gate transistor 1031B to node Np. In response to $\overline{X}$=0, NMOS pull-down transistor 1033 does not turn on, and therefore the match line ML remains in its charged state to indicate the match condition between C=0 and D=0. Conversely, if the data value is logic high (e.g., D=1), as indicated by X=0 and Y=1, then the logic high value ($\overline{X}$=1) provided by first memory cell 1010 propagates through pass gate transistor 1031B to node Np. In response to $\overline{X}$=1, NMOS pull-down transistor 1033 turns on and discharges the match line ML low toward ground potential to indicate the mismatch condition between C=0 and D=1.

In accordance with the present embodiments, the compare circuit 1030 of XY CAM cell 1000 includes only one match line discharge transistor 1033 coupled between match line ML and ground potential, as shown in FIG. 10A. In contrast, the conventional XY CAM cell 100 of FIG. 1A includes two series-connected transistors (e.g., transistors 131-132 and 133-134) in each pull-down path between the match line and ground potential. As a result, the XY CAM cell 1000 of present embodiments is faster than the conventional XY CAM cell 100 of FIG. 1A. More specifically, because the compare circuit 1030 employs a single stack pull-down element between the match line and ground potential, the XY CAM cell 1000 puts less pull-down resistance and less capacitive loading on the match line than the 2-stack pull-down elements employed in the conventional XY CAM cell 100, and therefore a CAM array such as CAM array 210 of FIG. 2 can employ more CAM cells 1000 in each row without degrading performance, as compared to employing conventional CAM cells 100. In addition, XY CAM cell 1000 may consume less power than conventional XY CAM cell 100 of FIG. 1. Further, because XY CAM cell 1000 includes only one pull-down stack (having a single pull-down transistor 1033) while XY CAM cell 100 includes two pull-down stacks (each having two pull-down transistors 131-132 or 133-134), XY CAM cell 1000 puts less capacitive loading on match line ML than does conventional XY CAM cell 100, thereby further increasing the benefits of CAM cell 1000 described above.

In addition, Applicant notes that the compare circuit 1030 of XY CAM cell 1000 of FIG. 10A includes only 5 transistors, while the compare circuit 420 of XY CAM cell 400 of FIG. 4 includes 6 transistors. Further, while XY CAM cell 400 of FIG. 4 includes two match line pull-down transistors 421x and 421y, XY CAM 1000 of FIG. 10A includes only one match line pull-down transistor 1033, and therefore XY CAM cell 1000 will put less capacitive loading on the match line and may consume less power than XY CAM cell 400, and may also have a smaller footprint than XY CAM cell 400.

Figure 11A:
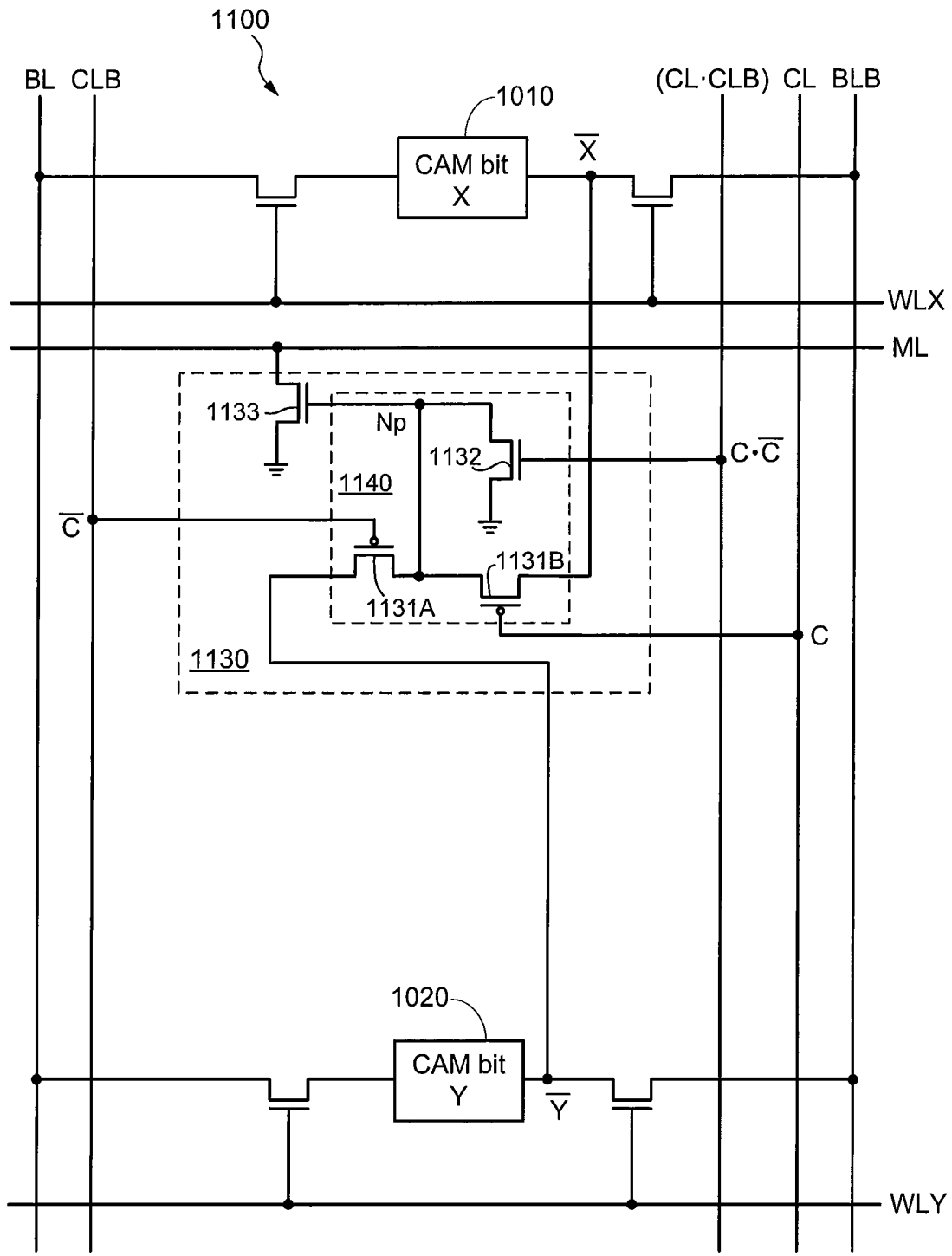
FIG. 11A is a block diagram of an XY CAM cell according to another embodiment.

FIG. 11A is a block diagram of an XY CAM cell 1100 according to another embodiment. The XY CAM cell 1100 includes two memory cells 1010 and 1020 coupled to a compare circuit 1130. As described above with respect to FIG. 10A, first memory cell 1010 stores a first data bit X, and second memory cell 1020 stores a second data bit Y. Together, the two data bits X and Y can collectively represent a data value having four possible states: "0", "1", "don't care", and a fourth state which may be left unused or may indicate "invalid," as depicted in the truth table 1050 of FIG. 10B.

More specifically, the logic "0" and "1" states correspond to the logic states represented by a conventional binary CAM cell. For each of these states, if the comparand data (e.g., provided to CAM cell 1100 via complementary comparand lines CL and CLB) matches the data value stored in CAM cell 1100, the compare circuit 1130 does not discharge the match line ML, which remains in its charged state to indicate a match condition. Conversely, if the comparand data does not match the data value stored in CAM cell 1100, compare circuit 1130 discharges ML (e.g., toward ground potential) to indicate the mismatch condition. For the "don't care" state, the logic high values for X and Y cause compare circuit 1130 to remain in a non-conductive state, thereby preventing match line ML from discharging. In this manner, the data value stored in CAM cell 1100 is masked from the compare operation, thereby forcing a match condition for CAM cell 1100, regardless of the comparand data. For the "invalid" state, the logic low values for X and Y cause compare circuit 1130 to remain in a conductive state to discharge the match line to indicate a mismatch condition, irrespective of the comparand data. For some embodiments, the "invalid" state can be used to disable a row of the CAM array containing one or more XY CAM cells 1100, for example, as described in commonly-owned U.S. Pat. No. 6,865,098.

The compare circuit 1130 includes one NMOS match line pull-down transistor 1133, two PMOS pass transistors 1131A and 1131B, and one NMOS gating transistor 1132. The first pass transistor 1131A and gating transistor 1132 form a first selective pull-down circuit that controls the match line pull-down transistor 1133 to selectively discharge the match line ML in response to a comparison between the complemented comparand bit ($\overline{C}$) provided on CLB and the Y bit provided by second memory cell 1020, and the second pass transistor 1131B and gating transistor 1132 form a second selective pull-down circuit that controls the match line pull-down transistor 1133 to selectively discharge the match line ML in response to a comparison between the comparand bit (C) provided on CL and the $\overline{X}$ bit provided by first memory cell 1010. Together, first selective pull-down circuit and second selective pull-down circuit form a match line pull-down control logic 1140.

More specifically, the NMOS match line pull-down transistor 1133 is coupled between match line ML and ground potential, and has a gate coupled to a pull-down node (Np) that receives signals from the match line pull-down control logic 1140. For the match line pull-down control logic 1140, the first PMOS pass transistor 1131A is coupled between pull-down node Np and second memory cell 1020 to receive the $\overline{Y}$ bit, and has a gate to receive the complemented comparand bit $\overline{C}$ from CLB during compare operations. The second PMOS pass transistor 1131B is coupled between the pull-down node Np and first memory cell 1010 to receive the $\overline{X}$ bit, and has a gate to receive the comparand bit C from CL during compare operations. The NMOS gating transistor 1132 is coupled between the pull-down node Np and ground potential, and has a gate coupled to a comparand signal gating line (CL•CLB) that provides a logical AND combination of the C and $\overline{C}$ bits (hereinafter referred to as C•$\overline{C}$) during compare operations. Note that the comparand signal gating line CL•CLB provides C•$\overline{C}$ to each CAM cell in the corresponding column of the CAM array. In some embodiments, the signal C•$\overline{C}$ provided on the comparand signal gating line CL•CLB can be generated from comparand register 230 (see also FIG. 2).

For other embodiments, the comparand lines CL and CLB can be reversed, which in turn reverses the polarity of compare operations. Similarly, for other embodiments, compare circuit 1130 can receive the bit values X and Y from the respective memory cells 1010 and 1020 (instead of receiving $\overline{X}$ and $\overline{Y}$), in which case the positions of data value "invalid" and "don't care" in table 1050 are reversed.

An exemplary compare operation between a comparand bit C and the data value stored in the CAM cell 1100 is now described. During a pre-charge phase of the compare operation, the match line ML is pre-charged to logic high (e.g., towards VDD) by a suitable pre-charge circuit (not shown for simplicity), and the comparand lines CL/CLB are both pre-charged to logic high (e.g., towards VDD). The logic high state of CLB turns off PMOS transistor 1131A, and the logic high state of CL turns off PMOS transistor 1131B. Because the logic states of CL and CLB are both high, the logic state of CL•CLB is also driven to logic high. The logic high state of CL•CLB turns on NMOS transistor 1132, which pulls the gate of match line pull-down transistor 1133 (e.g., at pull-down node Np) low towards ground potential, thereby maintaining transistor 1133 in a non-conductive state to isolate the match line ML from ground potential. The non-conductive state of pass transistor 1131A isolates the second memory cell 1020 from node Np, thereby preventing the value of $\overline{Y}$ from being inadvertently pulled low to ground potential by the conductive NMOS transistor 1132. Similarly, the non-conductive state of transistor 1131B isolates the first memory cell 1010 from node Np, thereby preventing the value of $\overline{X}$ from being inadvertently pulled low to ground potential by the conductive NMOS transistor 1132.

Then, during an evaluation phase of the compare operation, the comparand bit C is provided in a complementary manner to the XY CAM cell 1100 via comparand lines CL and CLB. Because CL and CLB are typically driven to opposite logic states during compare operations, the logic state of comparand signal gating line CL•CLB is driven to logic low during the evaluation phase of the compare operation. The logic low state of CL•CLB turns off gating transistor 1132, thereby allowing pass transistors 1131A and 1131B to selectively turn on match line pull-down transistor 1133 and discharge the match line ML in response to the logic states of the comparand bit C and the stored data value D. If a comparand line is driven to logic high, then the corresponding selective pull-down circuit is disabled and does not discharge the match line ML. Conversely, if a comparand line is driven to logic low, then the corresponding selective pull-down circuit is enabled and selectively discharges the match line ML in response to the corresponding data bit provided by the associated memory cell. If both CL and CLB are driven to logic high (e.g., to achieve a column-masking function), then both selective pull-down circuits are disabled and together prevent the match line ML from discharging, thereby causing the CAM cell 1100 to indicate a match condition on ML, irrespective of the data value. More specifically, the logic high states of C and $\overline{C}$ result in signal line CL•CLB being driven to logic high, which turns on NMOS transistor 1132 to pull node Np low towards ground potential, thereby maintaining pull-down transistor 1133 in a non-conductive state to prevent match line ML from being discharged.

For one example, if the comparand bit is logic high (e.g., C=1 and $\overline{C}$=0), then CL is driven to logic high and CLB is driven to logic low. The logic high state of CL disables the second selective pull-down circuit (in the manner described above), and prevents the $\overline{X}$ bit provided by first memory cell 1010 from affecting the compare operation. The logic low state of CLB enables the first selective pull-down circuit (in the manner described above), and allows the $\overline{Y}$ bit provided by second memory cell 1020 to selectively discharge the match line ML via the match line pull-down transistor 1133. Thus, if the data value is logic high (e.g., D=1), as indicated by X=0 and Y=1, then the logic low value ($\overline{Y}$=0) provided by second memory cell 1020 propagates through pass gate transistor 1131A to node Np. In response to $\overline{Y}$=0, NMOS pull-down transistor 1133 does not turn on, and therefore the match line ML remains in its charged state to indicate the match condition between C=1 and D=1. Conversely, if the data value is logic low (e.g., D=0), as indicated by X=1 and Y=0, then the logic high value ($\overline{Y}$=1) provided by second memory cell 1020 propagates through pass gate transistor 1131A to node Np. In response to $\overline{Y}$=1, NMOS pull-down transistor 1133 turns on and discharges the match line ML low toward ground potential to indicate the mismatch condition between C=1 and D=0.

The XY CAM cell 1100 operates in a complementary manner for compare operations in which the comparand bit is logic low (e.g., C=0 and $\overline{C}$=1), where CL is driven to logic low and CLB is driven to logic high. More specifically, the logic low state of CL enables second selective pull-down circuit (in the manner described above), and allows the $\overline{X}$ bit provided by first memory cell 1010 to selectively discharge the match line ML. The logic high state of CLB disables first selective pull-down circuit (in the manner described above), and prevents the $\overline{Y}$ bit provided by second memory cell 1020 from affecting the compare operation. Thus, if the stored data value is logic low (e.g., D=0), as indicated by X=1 and Y=0, then the logic low value ($\overline{X}$=0) provided by first memory cell 1010 propagates through pass gate transistor 1131B to node Np. In response to $\overline{X}$=0, NMOS pull-down transistor 1133 does not turn on, and therefore the match line ML remains in its charged state to indicate the match condition between C=0 and D=0. Conversely, if the data value is logic high (e.g., D=1), as indicated by X=0 and Y=1, then the logic high value ($\overline{X}$=1) provided by first memory cell 1010 propagates through pass gate transistor 1131B to node Np. In response to $\overline{X}$=1, NMOS pull-down transistor 1133 turns on and discharges the match line ML low toward ground potential to indicate the mismatch condition between C=0 and D=1.

In accordance with the present embodiments, the compare circuit 1130 of XY CAM cell 1100 includes only one match line pull-down transistor 1133 coupled between the match line and ground potential, as shown in FIG. 11A. In contrast, the conventional XY CAM cell 100 of FIG. 1A includes two series-connected transistors (e.g., transistors 131-132 and 133-134) in each pull-down path between the match line and ground potential. As a result, the XY CAM cell 1100 of present embodiments is faster than the conventional XY CAM cell 100 of FIG. 1A. More specifically, because the compare circuit 1130 employs a single stack pull-down element between the match line and ground potential, the XY CAM cell 1100 puts less pull-down resistance and less capacitive loading on the match line than the 2-stack pull-down elements employed in the conventional XY CAM cell 100, and therefore a CAM array such as CAM array 210 of FIG. 2 can employ more CAM cells 1100 in each row without degrading performance, as compared to employing conventional CAM cells 100.

In addition, Applicant notes that the compare circuit 1130 of XY CAM cell 1100 of FIG. 11A includes only 4 transistors, while the compare circuit 420 of XY CAM cell 400 of FIG. 4 includes 6 transistors. Further, while XY CAM cell 400 of FIG. 4 includes two match line pull-down transistors 421x and 421y, XY CAM 1100 of FIG. 11A includes only one match line pull-down transistor 1133, and therefore XY CAM cell 1100 will put less capacitive loading on the match line and may consume less power than XY CAM cell 400. Further, because compare circuit 1130 of FIG. 11A includes fewer transistors than compare circuit 1030 of FIG. 10A, XY CAM cell 1100 of FIG. 11A may have a smaller footprint than XY CAM cell 1000 of FIG. 10A.

Figure 11B:
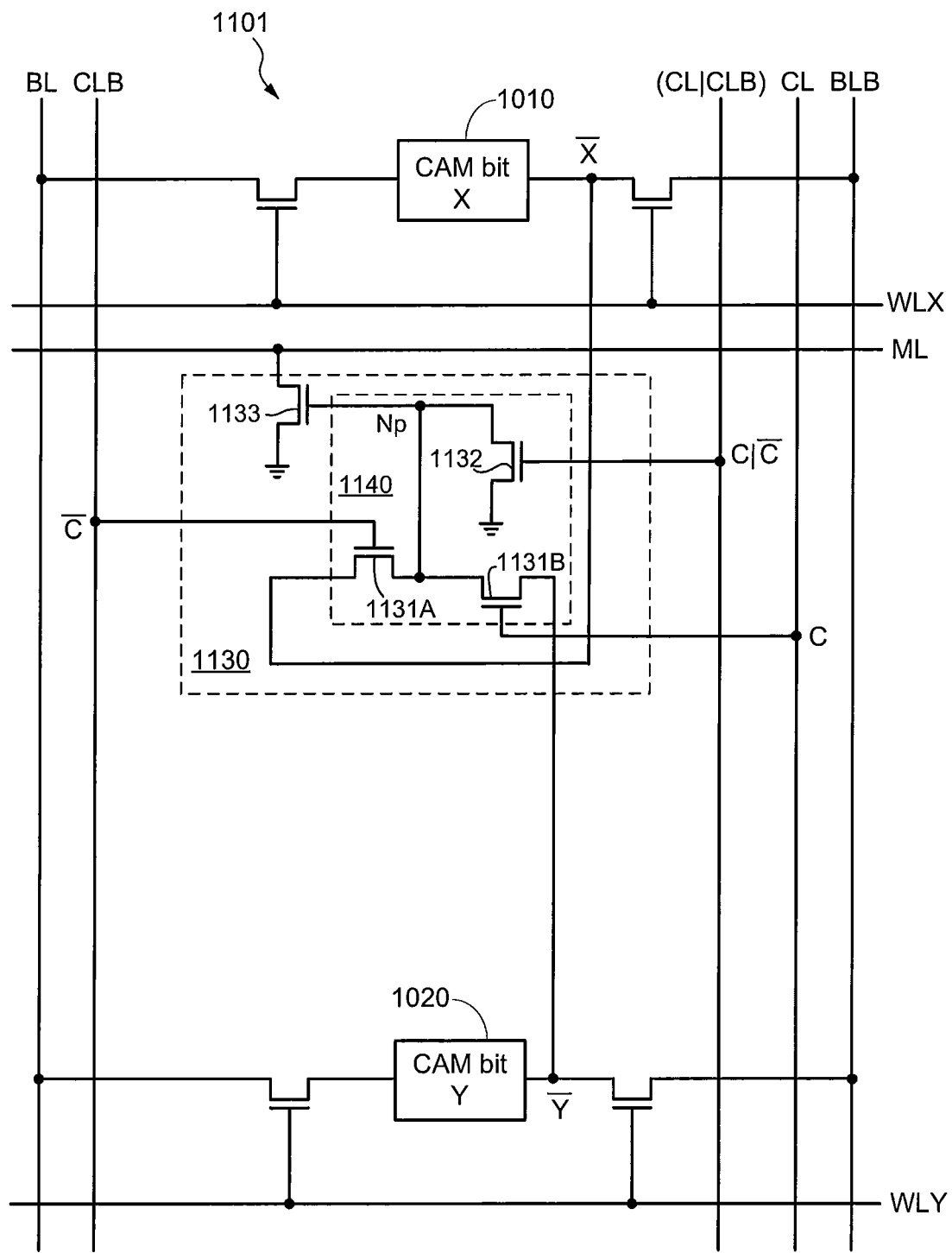
FIG. 11B is a block diagram of an XY CAM cell according to yet another embodiment.

For still other embodiments, pass transistors 1131A and 1132B can be NMOS transistors, for example, as depicted in FIG. 11B. Thus, the XY CAM cell 1101 shown in FIG. 11B is similar to the XY CAM cell 1100 of FIG. 11A, except that pass transistors 1131A and 1132B are NMOS transistors, the $\overline{X}$ and $\overline{Y}$ connections are reversed (as compared to XY CAM cell 1100 of FIG. 11A), and the comparand signal gating line (CL•CLB) of CAM cell 1101 is replaced with a comparand signal gating line (CL|CLB) that provides a logical NOR combination of the C and $\overline{C}$ bits. By employing only NMOS transistors, XY CAM cell 1101 may occupy less silicon area than XY CAM cell 1100 of FIG. 11A, for example, because dual-well process technologies are not necessary for the CAM cell compare circuit 1130. Compare operations for XY CAM cell 1101 are similar to those of XY CAM cell 1100, except that the comparand line pair CL and CLB of FIG. 11B are pre-charged to logic low (e.g., towards ground potential) during the pre-charge phase of the compare operation, and then are selectively driven to logic high (e.g., towards VDD) during the evaluation phase of the compare operation. Pre-charging the comparand line pair CL and CLB to logic low rather than to logic high can be advantageous, for example, because this ensures that node Np will always be low.

Figure 12:
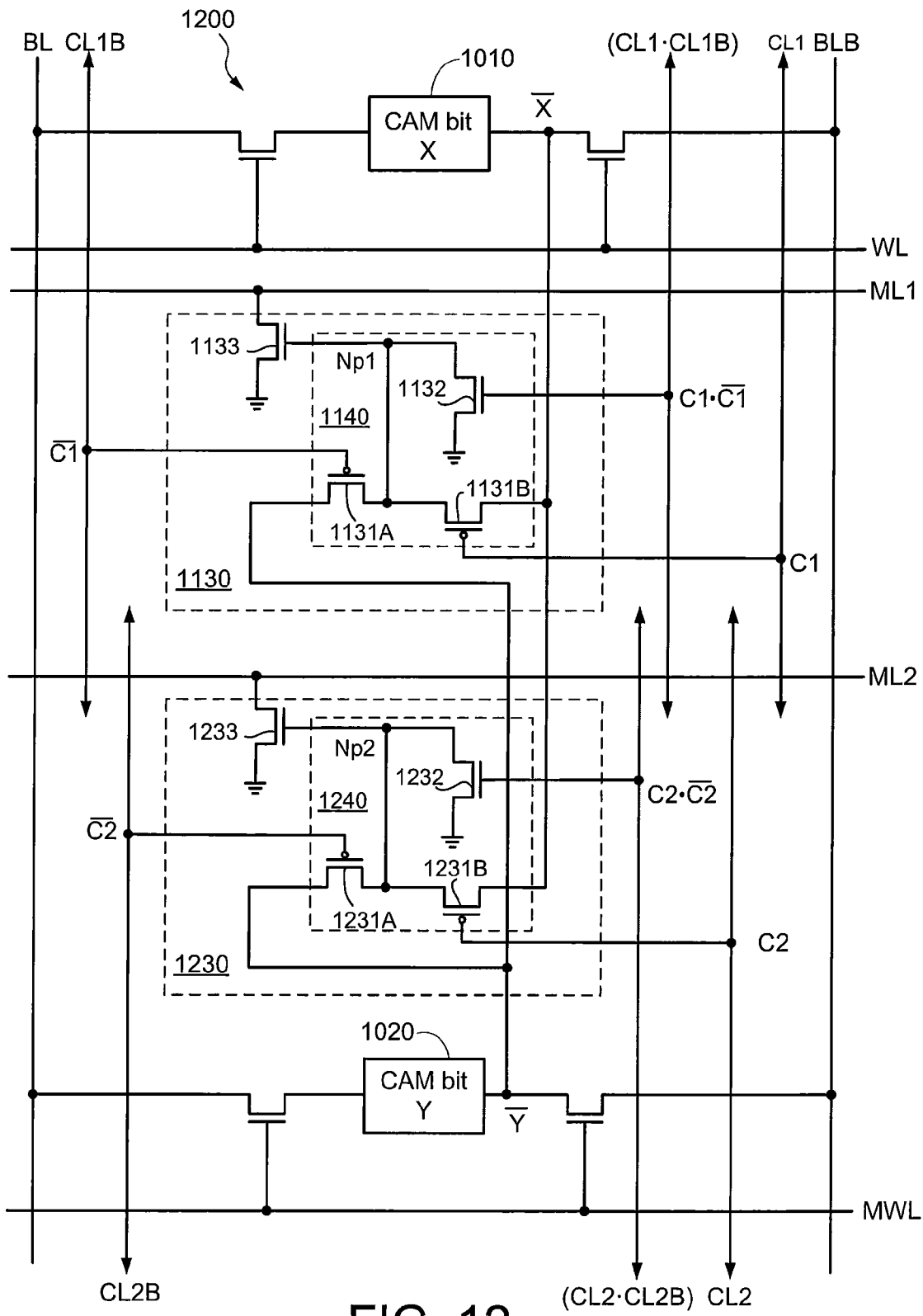
FIG. 12 is a block diagram of an XY CAM cell according to still another embodiment.

FIG. 12 is a block diagram of an XY CAM cell 1200 according to yet another embodiment. The XY CAM cell 1200, which is similar to XY CAM cell 1100 of FIG. 11A, is modified to include a second compare circuit 1230 that allows CAM cell 1200 to perform two compare operations with the data value stored therein at the same time, or alternatively in a sequential (e.g., staggered) manner. More specifically, the XY CAM cell 1200 can simultaneously compare the stored data value D with a first comparand bit (C1) provided on a first pair of complementary comparand lines CL1/CL1B and with a second comparand bit (C2) provided on a second pair of complementary comparand lines CL2/CL2B, where the first pair of complementary comparand lines CL1/CL1B provides the first comparand bit C1 and its complement $\overline{C1}$ to the first compare circuit 1130, and the second pair of complementary comparand lines CL2/CL2B provides the second comparand bit C2 and its complement $\overline{C2}$ to the second compare circuit 1230. Match conditions between the data value and the first comparand bit C1 are provided on a first match line ML1 by the first compare circuit 1130, and match conditions between the data value and the second comparand bit C2 are provided on a second match line ML2 by the second compare circuit 1230. The comparand signal gating lines CL1•CL1B and CL2•CL2B provide logical AND combinations of C1•C1 and C2•C2, respectively, to the corresponding compare circuits 1130 and 1230 in a manner similar to that described above with respect to FIG. 11A.

The second compare circuit 1230 includes one NMOS match line pull-down transistor 1233, two PMOS pass transistors 1231A and 1231B, and one NMOS gating transistor 1232. The first pass transistor 1231A and gating transistor 1232 form a first selective pull-down circuit that controls the match line pull-down transistor 1233 to selectively discharge the second match line ML2 in response to a comparison between the complemented second comparand bit ($\overline{C2}$) provided on CL2B and the $\overline{Y}$ bit, and the second pass transistor 1231B and gating transistor 1232 form a second selective pull-down circuit that controls the match line pull-down transistor 1233 to selectively discharge the second match line ML2 in response to a comparison between the second comparand bit (C2) provided on CL2 and the $\overline{X}$ bit. Together, first selective pull-down circuit and second selective pull-down circuit form a second match line pull-down control logic 1240.

More specifically, the NMOS match line pull-down transistor 1233 is coupled between the second match line ML2 and ground potential, and has a gate coupled to a second pull-down node (Np2) that receives signals from the second match line pull-down control logic 1240. For the second match line pull-down control logic 1240, the first PMOS pass transistor 1231A is coupled between the second pull-down node Np2 and second memory cell 1020 to receive the $\overline{Y}$ bit, and has a gate to receive the complemented second comparand bit $\overline{C2}$ from CL2B during compare operations. The second PMOS pass transistor 1231B is coupled between the second pull-down node Np2 and first memory cell 1010 to receive the $\overline{X}$ bit, and has a gate to receive the second comparand bit C2 from CL2 during compare operations. The NMOS gating transistor 1232 is coupled between the second pull-down node Np2 and ground potential, and has a gate coupled to second comparand gating line (CL2•CL2B).

Compare operations for XY CAM cell 1200 are performed in a manner similar to that described above with respect to CAM cell 1100 of FIG. 11A, except that XY CAM cell 1200 can perform two compare operations at the same time (or alternately in a sequential or staggered manner). Thus, during the pre-charge phase of the compare operation, the first and second match lines ML1 and ML2 are both pre-charged to logic high (e.g., towards VDD) by suitable pre-charge circuits (not shown for simplicity), and the both sets of complementary comparand lines CL1/CL1B and CL2/CL2B are pre-charged to logic high (e.g., towards VDD). In this manner, during the pre-charge phase, the first compare circuit 1130 isolates the first match line ML1 from ground potential, and the second compare circuit 1230 isolates the second match line ML2 from ground potential.

Then, during the evaluation phase of the compare operation, the first comparand bit C1 is provided to the XY CAM cell 1200 in a complementary manner via comparand lines CL1 and CL1B, and the second comparand bit C2 is provided to the XY CAM cell 1200 in a complementary manner via comparand lines CL2 and CL2B. If a comparand line is driven to logic high, then the corresponding selective pull-down circuit in compare circuits 1130/1230 is disabled and does not discharge its associated match line ML. Conversely, if a comparand line is driven to logic low, then the corresponding selective pull-down circuit in compare circuits 1130/1230 is enabled and selectively discharges its associated match line ML in response to the corresponding data bit provided by the associated memory cell. More specifically, if both CL1 and CL1B are driven to logic high (e.g., to achieve a column-masking function), then both selective pull-down circuits in compare circuit 1130 are disabled and together prevent the first match line ML1 from discharging, thereby causing the CAM cell 1200 to indicate a match condition on ML1 irrespective of the data value. Similarly, if both CL2 and CL2B are driven to logic high (e.g., to achieve a column-masking function), then both selective pull-down circuits in compare circuit 1230 are disabled and together prevent the second match line ML2 from discharging, thereby causing the CAM cell 1200 to indicate a match condition on ML2 irrespective of the data value.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer aided design tools and expressed (or represented), as data and/or instructions embodied in various non-transitory computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Non-transitory computer-readable media in which such formatted data and/or instructions may be embodied include, but are not limited to, non-volatile storage media in various forms (e.g., optical, magnetic or semiconductor storage media).

What is claimed is:

1. A quaternary content addressable memory (CAM) cell for storing a data value having one of four possible states represented by first and second data bits, the CAM cell comprising:
   first and second memory cells for storing the first and second data bits, respectively;
   a first match line; and
   a first compare circuit coupled to the first and second memory cells and having a single discharge path between the first match line and ground potential, the single discharge path consisting essentially of a single transistor, wherein the single transistor has a gate coupled to a pull-down node, and the first compare circuit further comprises:
   first and second gating transistors connected in series between the pull-down node and ground potential, the first gating transistor having a gate to receive a comparand bit, and the second gating transistor having a gate to receive a complemented comparand bit.

2. The CAM cell of claim 1, wherein the first compare circuit further comprises:
   a first pass transistor coupled between the second memory cell and the pull-down node, and having a gate to receive the complemented comparand bit; and
   a second pass transistor coupled between the first memory cell and the pull-down node, and having a gate to receive the comparand bit.

3. The CAM cell of claim 2, wherein the first and second gating transistors are NMOS transistors, and the first and second pass transistors are PMOS transistors.

4. A quaternary content addressable memory (CAM) cell for storing a data value having one of four possible states represented by first and second data bits, the CAM cell comprising:
   first and second memory cells for storing the first and second data bits, respectively;
   a first match line; and a first compare circuit coupled to the first and second memory cells and having a single discharge path between the first match line and ground potential, the single discharge path consisting essentially of a single transistor, wherein the single transistor has a gate coupled to a pull-down node, and the first compare circuit further comprises:
a first pass transistor coupled between the first memory cell and the pull-down node, and having a gate to receive a comparand bit;
a second pass transistor coupled between the second memory cell and the pull-down node, and having a gate to receive a complemented comparand bit; and
a single gating transistor coupled between the pull-down node and ground potential, and having a gate responsive to a logical combination of the comparand bit and the complemented comparand bit.

5. The CAM cell of claim 4, wherein the gating transistor is an NMOS transistor, and the first and second pass transistors are PMOS transistors.

6. The CAM cell of claim 4, wherein the logical combination comprises a logical AND function.

7. The CAM cell of claim 4, wherein the gate of the gating transistor is coupled to a comparand signal gating line.

8. A quaternary content addressable memory (CAM) cell for storing a data value having one of four possible states represented by first and second data bits, the CAM cell comprising:
first and second memory cells for storing the first and second data bits, respectively;
a first match line; and
a first compare circuit coupled to the first and second memory cells and having a single discharge path between the first match line and ground potential, the single discharge path consisting essentially of a single transistor, wherein the single transistor has a gate coupled to a pull-down node, and the first compare circuit further comprises:
a first pass transistor coupled between the second memory cell and the pull-down node, and having a gate to receive a comparand bit;
a second pass transistor coupled between the first memory cell and the pull-down node, and having a gate to receive a complemented comparand bit; and
a single gating transistor coupled between the pull-down node and ground potential, and having a gate responsive to a logical combination of the comparand bit and the complemented comparand bit.

9. The CAM cell of claim 8, wherein the gating transistor is an NMOS transistor, and the first and second pass transistors are NMOS transistors.

10. The CAM cell of claim 8, wherein the logical combination comprises a logical NOR function.

11. A quaternary content addressable memory (CAM) cell for storing a data value having one of four possible states represented by first and second data bits, the CAM cell comprising:
first and second memory cells for storing the first and second data bits, respectively; and
a compare circuit to compare a comparand bit with the data value, the compare circuit comprising:
a single pull-down transistor coupled between the match line and ground potential, and having a gate coupled to a pull-down node; and
first and second gating transistors connected in series between the pull-down node and ground potential, the first gating transistor having a gate to receive the comparand bit, and the second gating transistor having a gate to receive a complemented comparand bit.

12. The CAM cell of claim 11, wherein the single pull-down transistor is the only discharge path between the match line and ground potential.

13. The CAM cell of claim 11, wherein the compare circuit further comprises:
a first pass transistor coupled between the second memory cell and the pull-down node, and having a gate to receive the complemented comparand bit; and
a second pass transistor coupled between the first memory cell and the pull-down node, and having a gate to receive the comparand bit.

14. The CAM cell of claim 13, wherein the first and second gating transistors are NMOS transistors, and the first and second pass transistors are PMOS transistors.

15. A quaternary content addressable memory (CAM) cell for storing a data value having one of four possible states represented by first and second data bits, the CAM cell comprising:
first and second memory cells for storing the first and second data bits, respectively; and
a compare circuit to compare a comparand bit with the data value, the compare circuit comprising:
a single pull-down transistor coupled between the match line and ground potential, and having a gate coupled to a pull-down node;
a first pass transistor coupled between the first memory cell and the pull-down node, and having a gate to receive the comparand bit; and
a second pass transistor coupled between the second memory cell and the pull-down node, and having a gate to receive a complemented comparand bit.

16. The CAM cell of claim 15, wherein the single pull-down transistor is the only discharge path between the match line and ground potential.

17. The CAM cell of claim 15, wherein the compare circuit further comprises:
a gating transistor coupled between the pull-down node and ground potential, and having a gate responsive to a logical combination of the comparand bit and the complemented comparand bit.

18. The CAM cell of claim 17, wherein the logical combination comprises a logical AND function.

19. The CAM cell of claim 17, wherein the logical combination comprises a logical NOR function.

20. The CAM cell of claim 17, wherein the gate of the gating transistor is coupled to a comparand signal gating line.

21. The CAM cell of claim 15, further comprising:
a second compare circuit coupled to the first and second memory cells, and including a single discharge path between a second match line and ground potential, the single discharge path consisting essentially of a single discharge transistor.

* * * * *